United States Patent
Akou et al.

(10) Patent No.: US 11,251,122 B2
(45) Date of Patent: Feb. 15, 2022

(54) SEMICONDUCTOR DEVICE HAVING A BONDING PAD AREA OF A FIRST WIRING LAYER OVERLAPS A BONDING PAD ELECTRODE OF A SECOND WIRING LAYER

(71) Applicant: Kioxia Corporation, Minato-ku (JP)

(72) Inventors: Masayuki Akou, Yokohama (JP); Mitsuhiro Noguchi, Yokohama (JP); Yuuichi Tatsumi, Setagaya (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/984,208

(22) Filed: Aug. 4, 2020

(65) Prior Publication Data

US 2021/0134713 A1    May 6, 2021

(30) Foreign Application Priority Data

Oct. 30, 2019  (JP) .............................. JP2019-197445

(51) Int. Cl.
| | |
|---|---|
| *H01L 23/528* | (2006.01) |
| *H01L 27/11526* | (2017.01) |
| *H01L 27/11573* | (2017.01) |
| *H01L 25/18* | (2006.01) |
| *H01L 23/00* | (2006.01) |

(52) U.S. Cl.
CPC ............ *H01L 23/528* (2013.01); *H01L 24/05* (2013.01); *H01L 24/48* (2013.01); *H01L 25/18* (2013.01); *H01L 27/11526* (2013.01); *H01L 27/11573* (2013.01); *H01L 2224/04042* (2013.01); *H01L 2224/48145* (2013.01)

(58) Field of Classification Search
CPC combination set(s) only.
See application file for complete search history.

(56) References Cited

U.S. PATENT DOCUMENTS

| | | | |
|---|---|---|---|
| 8,310,056 B2 | 11/2012 | Oda et al. | |
| 2008/0017991 A1 | 1/2008 | Kim | |
| 2009/0184424 A1 | 7/2009 | Furusawa et al. | |
| 2015/0115269 A1* | 4/2015 | Ishii | H01L 24/09 257/48 |
| 2015/0162296 A1 | 6/2015 | Risaki et al. | |

(Continued)

FOREIGN PATENT DOCUMENTS

JP          2012-15516 A        1/2012

*Primary Examiner* — Mamadou L Diallo
(74) *Attorney, Agent, or Firm* — Oblon, McClelland, Maier & Neustadt, L.L.P.

(57) ABSTRACT

A semiconductor device includes: wiring layers laminated in a first direction and including conducting members; and a second wiring layer including a bonding pad electrode. The first wiring layers each include a bonding pad area. The bonding pad area overlaps with the bonding pad electrode viewed in the first direction. The conducting member is absent in an area inside a first imaginary circle with a first point as a midpoint in the bonding pad area. The conducting members are disposed in an area outside a second imaginary circle in the bonding pad area. The second imaginary circle has the first point as a midpoint and has a radius equal to or more than a radius of the first imaginary circle. When the radius of the first imaginary circle is denoted as R1 and the radius of the second imaginary circle is denoted as R2, R2/R1 is smaller than $1/\cos(\pi/4)$.

16 Claims, 15 Drawing Sheets

(56) References Cited

U.S. PATENT DOCUMENTS

| | | | |
|---|---|---|---|
| 2015/0200185 A1* | 7/2015 | Yu | H01L 23/49838 |
| | | | 257/737 |
| 2015/0287700 A1* | 10/2015 | Yu | H01L 23/5386 |
| | | | 257/774 |
| 2016/0013144 A1* | 1/2016 | Chen | H01L 23/3128 |
| | | | 257/774 |
| 2016/0240487 A1* | 8/2016 | Hiranuma | H01L 23/66 |
| 2018/0374795 A1* | 12/2018 | Deguchi | H01L 21/768 |
| 2019/0295930 A1* | 9/2019 | Deguchi | H01L 23/49503 |
| 2021/0057361 A1* | 2/2021 | Isozaki | H01L 23/49513 |

* cited by examiner

SEMICONDUCTOR DEVICE HAVING A BONDING PAD AREA OF A FIRST WIRING LAYER OVERLAPS A BONDING PAD ELECTRODE OF A SECOND WIRING LAYER

CROSS-REFERENCE TO RELATED APPLICATIONS

This application is based upon and claims the benefit of Japanese Patent Application No. 2019-197445, filed on Oct. 30, 2019, the entire contents of which are incorporated herein by reference.

BACKGROUND

Field

Embodiments described herein relate to a semiconductor device.

Description of the Related Art

There has been known a semiconductor device that includes a substrate, a plurality of first wiring layers laminated in a first direction intersecting with a surface of the substrate, and a second wiring layer that is farther from the substrate than the plurality of first wiring layers and includes a bonding pad electrode.

DETAILED DESCRIPTION

Figure 1:
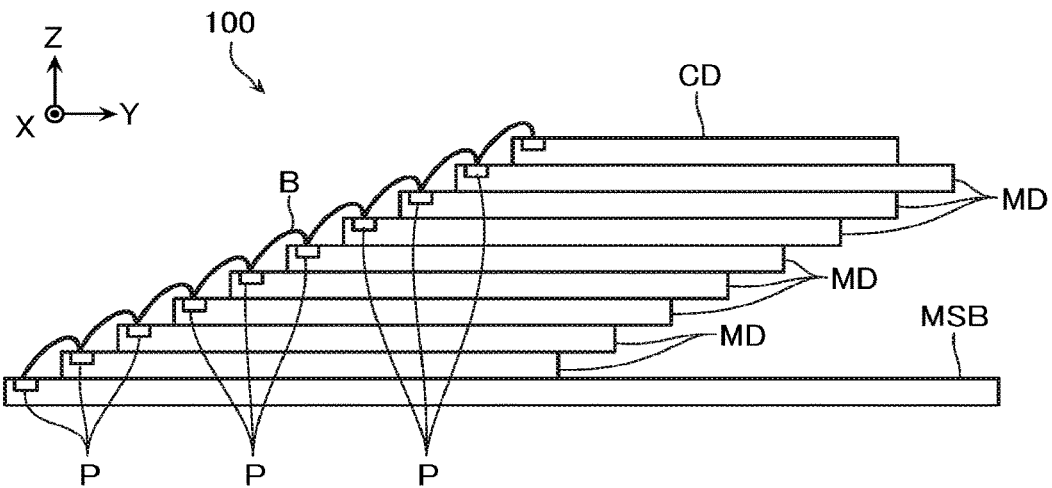
FIG. 1 is a schematic side view illustrating an exemplary configuration of a memory system 100 according to a first configuration of a first embodiment.

According to one embodiment, a semiconductor device comprises: a substrate; a plurality of first wiring layers laminated in a first direction intersecting with a surface of the substrate, the plurality of first wiring layers including a plurality of conducting members; and a second wiring layer that is farther from the substrate than the plurality of first wiring layers and includes a bonding pad electrode, wherein the plurality of first wiring layers each include a bonding pad area, and the bonding pad area overlaps with the bonding pad electrode viewed in the first direction, the conducting member is absent in an area inside a first imaginary circle with a first point as a midpoint in the bonding pad area, the conducting members are disposed in an area outside a second imaginary circle in the bonding pad area, the second imaginary circle has the first point as a midpoint and has a radius equal to or more than a radius of the first imaginary circle, and the conductive members being disposed in a predetermined pattern or the conducting members being disposed in the entire area outside the second imaginary circle in the bonding pad area, and when the radius of the first imaginary circle is denoted as R1 and the radius of the second imaginary circle is denoted as R2, R2/R1 is smaller than $1/\cos(\pi/4)$.

According to one embodiment, a semiconductor device comprises: a substrate; a plurality of first wiring layers laminated in a first direction intersecting with a surface of the substrate, the plurality of first wiring layers including a plurality of conducting members; and a second wiring layer that is farther from the substrate than the plurality of first wiring layers and includes a bonding pad electrode, wherein the plurality of first wiring layers each include a bonding pad area, and the bonding pad area overlaps with the bonding pad electrode viewed in the first direction, the bonding pad areas in the plurality of first wirings include any one of: a first pattern that includes the plurality of conducting members and insulating members, the plurality of conducting members extending in a second direction intersecting with the first direction, the plurality of conducting members being arranged in a third direction intersecting with the first direction and the second direction, the insulating members extending in the second direction and being arranged in the third direction, and the insulating members being disposed between the conducting members in the third direction; and a second pattern that includes the plurality of conducting members and insulating members, the plurality of conducting members extending in the third direction and being arranged in the second direction, the insulating members extending in the third direction and being arranged in the second direction, and the insulating members being disposed between the conducting members in the second direction.

Next, the semiconductor device according to the embodiments will be described in detail with reference to the drawings. The following embodiments are only examples, and not described for the purpose of limiting the present invention.

In this specification, a predetermined direction parallel to a surface of the semiconductor substrate is referred to as an X-direction, a direction parallel to the surface of the semiconductor substrate and perpendicular to the X-direction is referred to as a Y-direction, and a direction perpendicular to the surface of the semiconductor substrate is referred to as a Z-direction.

In this specification, a direction along a predetermined plane is referred to as a first direction, a direction intersecting with the first direction along this predetermined plane is referred to as a second direction, and a direction intersecting with this predetermined plane is referred to as a third direction in some cases. These first direction, second direction, and third direction may correspond to any of the X-direction, the Y-direction, and the Z-direction or need not to correspond to these directions.

Expressions such as "above" and "below" in this specification are based on the semiconductor substrate. For example, a direction away from the semiconductor substrate along the Z-direction is referred to as above and a direction approaching the semiconductor substrate along the Z-direction is referred to as below. A lower surface and a lower end portion of a certain configuration mean a surface and an end portion on the semiconductor substrate side of this configuration. A top surface and an upper end portion of a certain configuration mean a surface and an end portion on a side opposite to the semiconductor substrate of this configuration. A surface intersecting with the X-direction or the Y-direction is referred to as a side surface and the like.

In this specification, when referring to that a first configuration "is electrically connected" to a second configuration, the first configuration may be directly connected to the second configuration, or the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the first configuration is disposed on a current path between the second configuration and the third configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like turns ON.

First Embodiment

[First Configuration]
[Overall Configuration]

Figure 2:
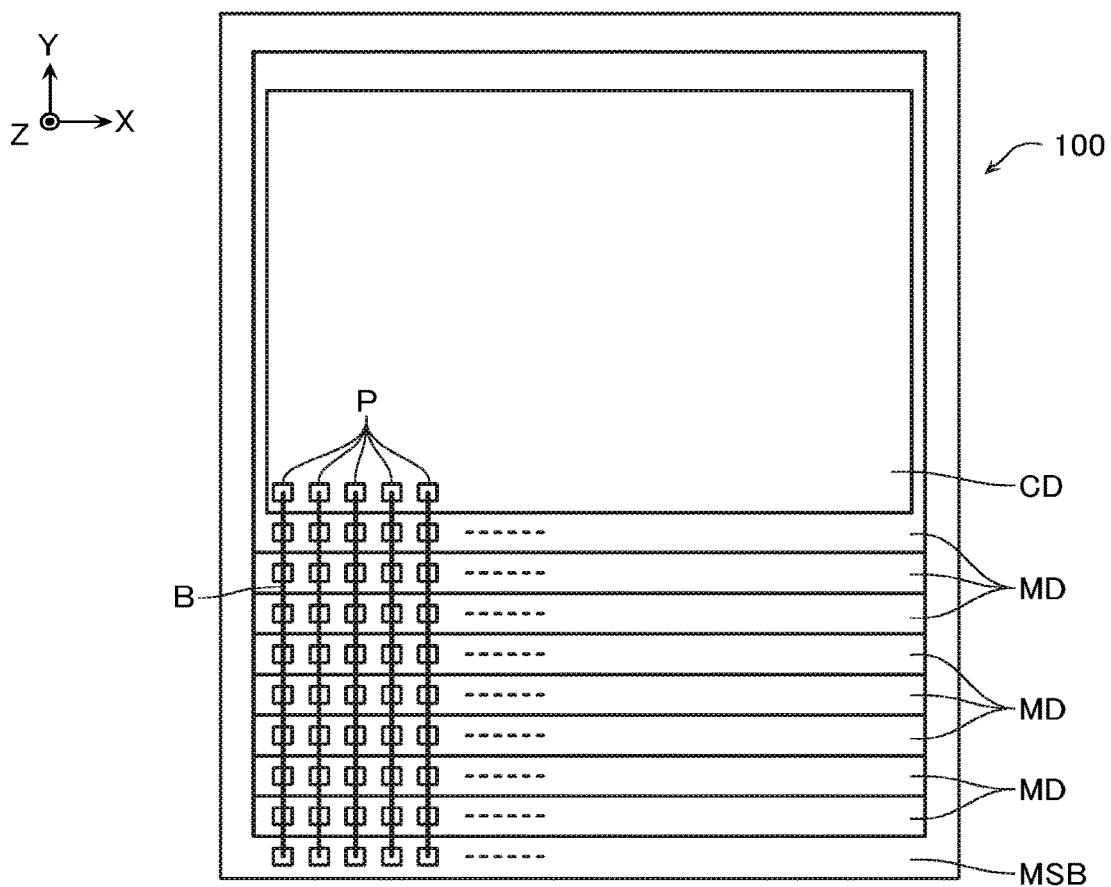
FIG. 2 is a schematic plan view illustrating an exemplary configuration of the memory system 100.

FIG. 1 is a schematic side view illustrating an exemplary configuration of a memory system 100 according to a first configuration of this embodiment. FIG. 2 is a schematic plan view illustrating an exemplary configuration of the memory system 100. For sake of convenience of explanation, FIG. 1 and FIG. 2 omit a part of the configuration.

As illustrated in FIG. 1, the memory system 100 according to the first configuration includes a mounting substrate MSB, a plurality of memory dies MD laminated on the mounting substrate MSB, and a control die CD laminated on the memory die MD. These configurations include bonding pad electrodes P formed on these upper surfaces, are laminated to be displaced in the Y-direction so that the bonding pad electrodes P are exposed, and are connected to one another via an adhesive and the like.

As illustrated in FIG. 2, the mounting substrate MSB, the plurality of memory dies MD, and the control die CD each include the plurality of bonding pad electrodes P. The plurality of respective bonding pad electrodes P disposed in the mounting substrate MSB, the plurality of memory dies MD, and the control die CD are connected to one another via bonding wires B.

Figure 3:
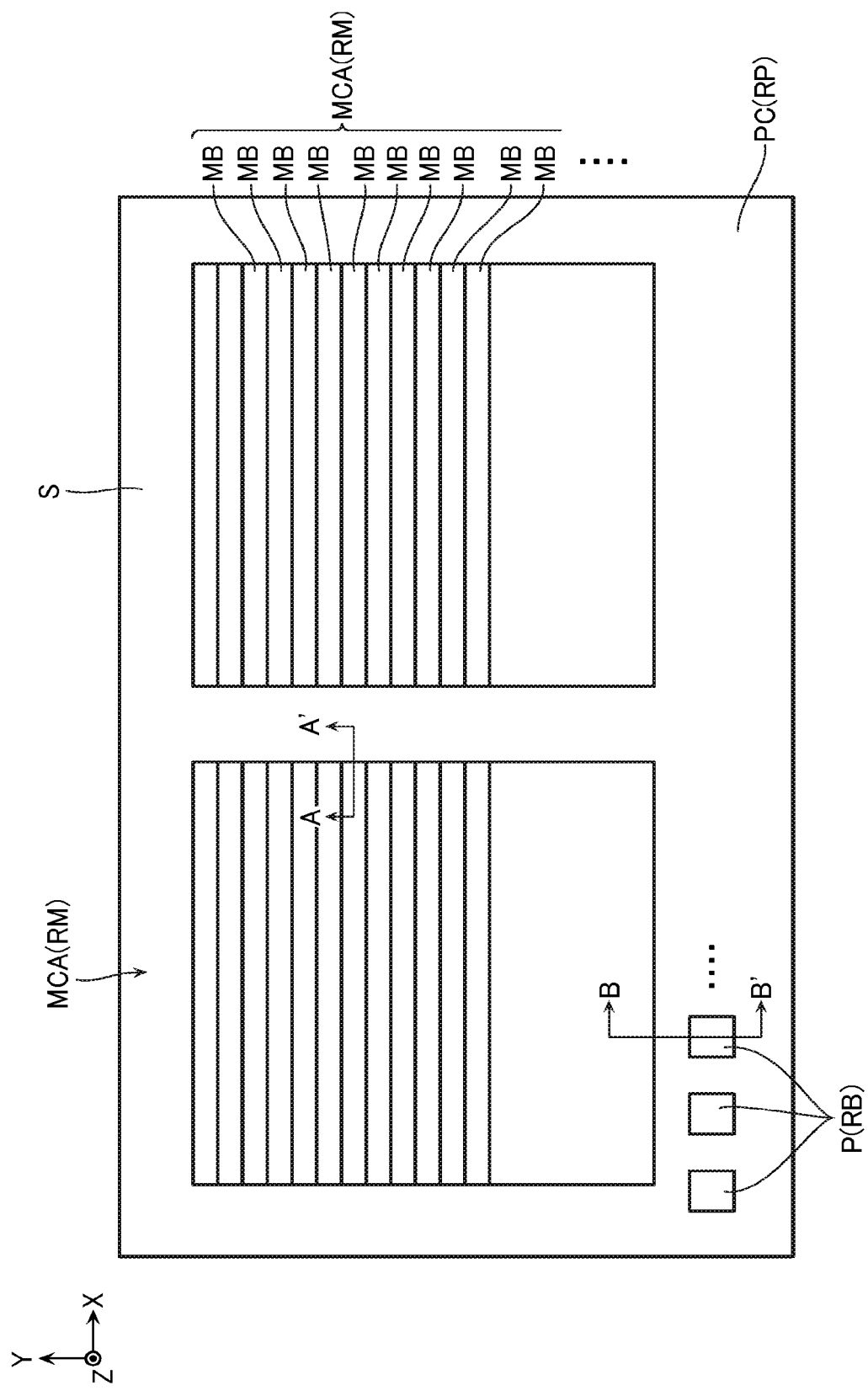
FIG. 3 is a schematic plan view illustrating a configuration of a memory die MD.

FIG. 3 is a schematic plan view illustrating a configuration of the memory die MD. In the example of FIG. 3, the memory die MD includes a semiconductor substrate S, memory cell arrays MCA disposed on an upper surface of the semiconductor substrate S, and a peripheral circuit PC disposed around the memory cell arrays MCA. In the example of FIG. 3, the two memory cell arrays MCA arranged in the X-direction are disposed on the upper surface of the semiconductor substrate S. The memory cell arrays MCA each include a plurality of memory blocks MB arranged in the Y-direction. Additionally, the bonding pad electrodes P (FIG. 1, FIG. 2) are disposed on a part of the peripheral circuit PC. Hereinafter, an area where the memory cell array MCA is disposed in the upper surface of the semiconductor substrate S may be referred to as a memory area RM. Additionally, an area where the peripheral circuit PC is disposed in the upper surface of the semiconductor substrate S may be referred to as a peripheral circuit area RP. An area where the bonding pad electrodes P is disposed in the peripheral circuit area RP may be referred to as a bonding pad area RB.

Figure 4:
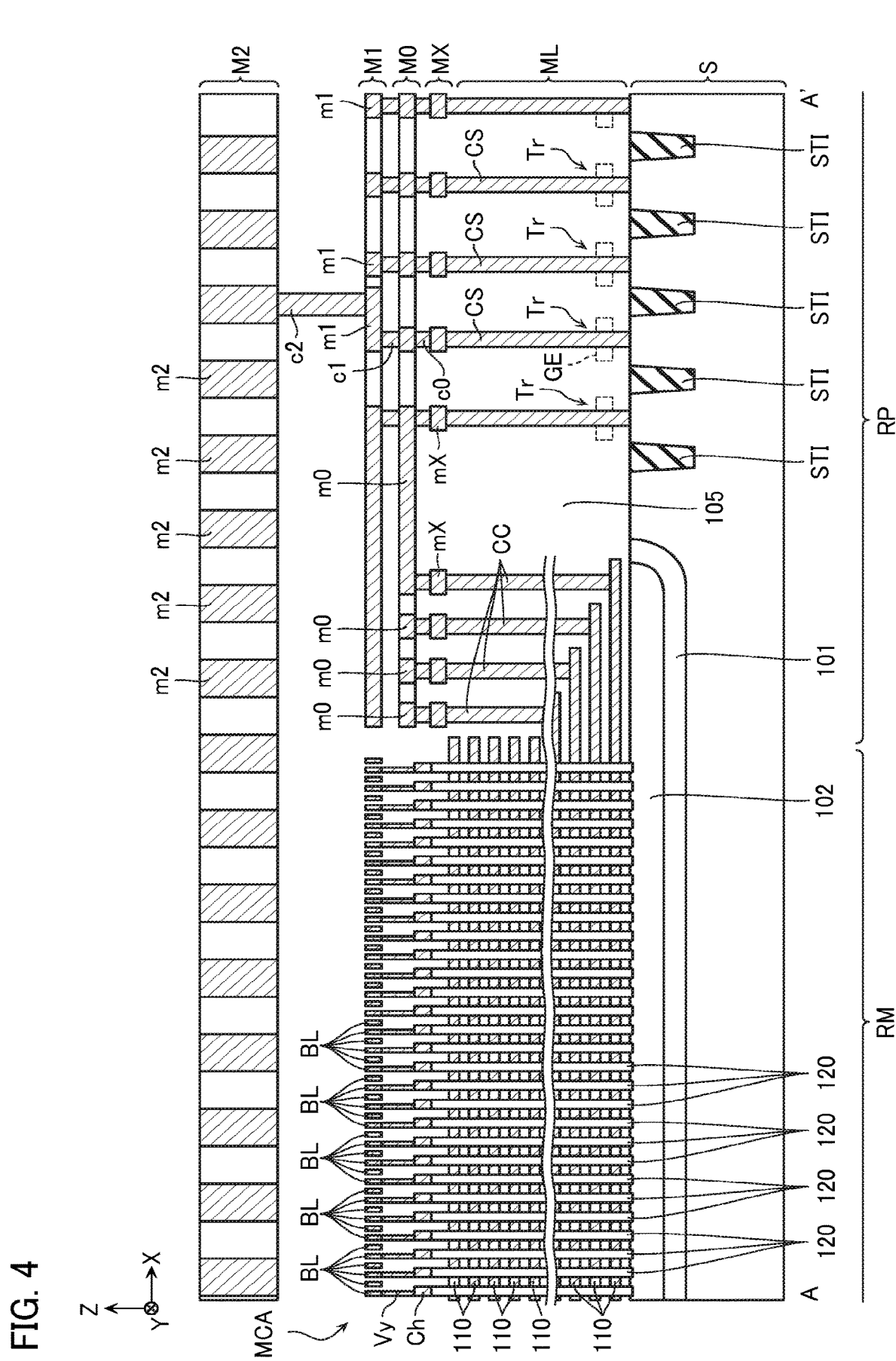
FIG. 4 is a schematic cross-sectional view taking the structure illustrated in FIG. 3 along the line A-A' and viewed in the arrow direction.
Figure 5:
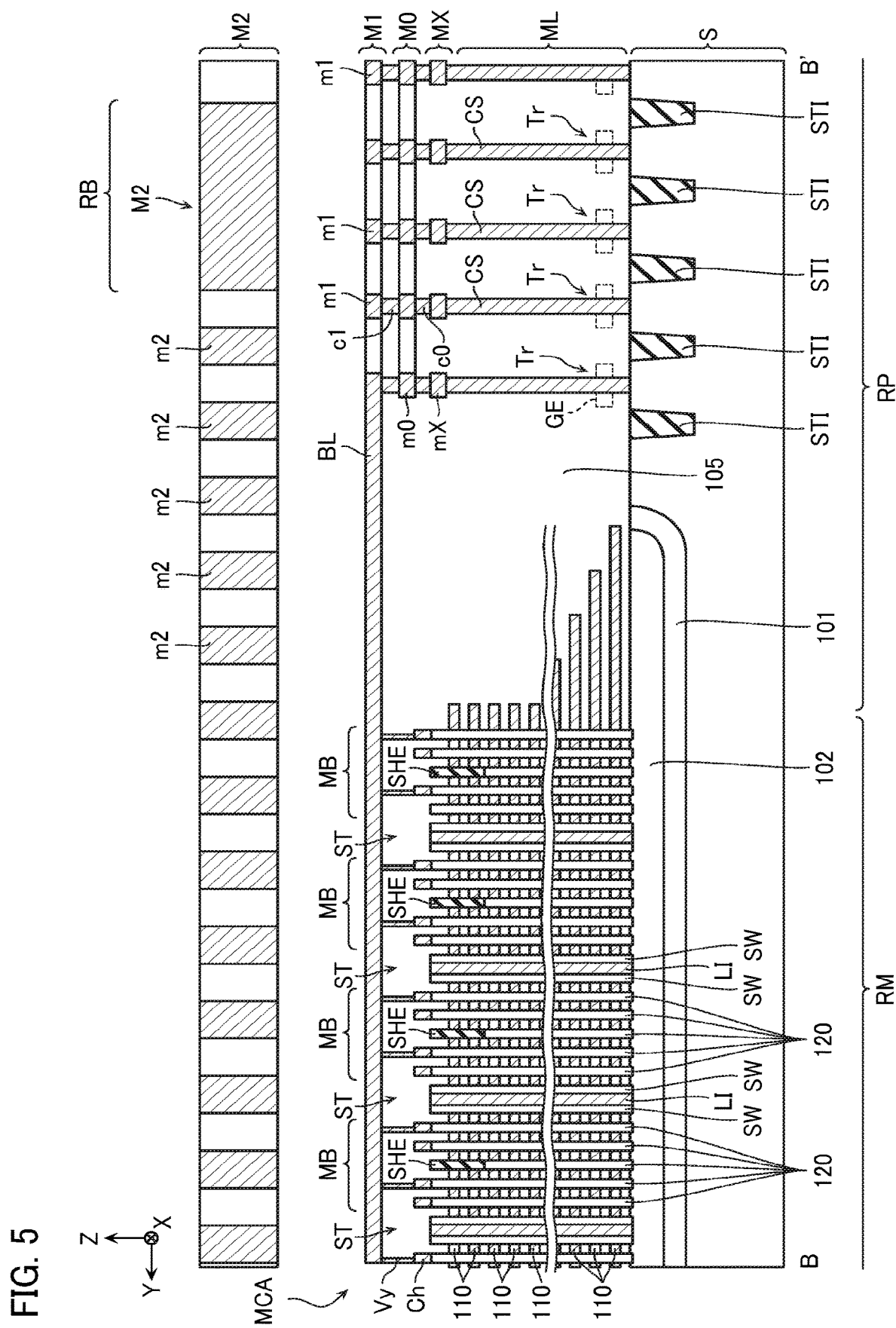
FIG. 5 is a schematic cross-sectional view taking the structure illustrated in FIG. 3 along the line B-B' and viewed in the arrow direction.

FIG. 4 is a schematic cross-sectional view taking the structure illustrated in FIG. 3 along the line A-A' and viewed in the arrow direction. FIG. 5 is a schematic cross-sectional view taking the structure illustrated in FIG. 3 along the line B-B' and viewed in the arrow direction. Note that FIG. 4 and FIG. 5 are schematic drawings for explanation and do not illustrate exact configurations, locations, or the like of respective configurations. For example, a further specific structure in the peripheral circuit area RP will be exemplified with reference to FIG. 6 to FIG. 13. Additionally, a wiring pattern and the like illustrated in FIG. 4 and FIG. 5 are also schematic, and the specific structure and the like can be appropriately adjusted.

As illustrated in FIG. 4, the memory die MD includes the semiconductor substrate S, a memory layer ML disposed on the upper surface of the semiconductor substrate S, a wiring layer MX disposed above the memory layer ML, a wiring layer M0 disposed above the wiring layer MX, a wiring layer M1 disposed above the wiring layer M0, and a wiring layer M2 disposed above the wiring layer M1.

The semiconductor substrate S is, for example, a semiconductor substrate containing P-type impurities, such as single-crystal silicon. An N-type well 101 containing N-type impurities is disposed at a part of the upper surface of the semiconductor substrate S. Additionally, a P-type well 102 containing P-type impurities is disposed at apart of the upper surface of the semiconductor substrate S. A part positioned in the memory area RM in the upper surface of the semiconductor substrate S functions as a channel area of a transistor that connects memory transistors and wirings LI (FIG. 5). A part positioned in the peripheral circuit area RP in the upper surface of the semiconductor substrate S functions as a channel area of a plurality of transistors Tr constituting a peripheral circuit. Note that a part that functions as the channel area of the plurality of transistors Tr in the upper surface of the semiconductor substrate S is divided via insulating portions STI, such as silicon oxide ($SiO_2$).

For example, as illustrated in FIG. 5, in the memory area RM in the memory layer ML, a plurality of memory blocks MB arranged in the Y-direction are disposed. Between the memory blocks MB arranged in the Y-direction, inter-block structures ST are disposed.

The memory block MB includes a plurality of conducting layers 110 arranged in the Z-direction and a plurality of semiconductor layers 120 extending in the Z-direction. The conducting layer 110 contains, for example, tungsten (W) and functions as, for example, a gate electrode of the memory transistor. Among the conducting layers 110, the plurality of conducting layers 110 positioned uppermost have widths in the Y-direction smaller than those of the other conducting layers 110. The conducting layers 110 are arranged in the Y-direction via insulating layers SHE, such as silicon oxide ($SiO_2$). The semiconductor layer 120 contains, for example, polycrystalline silicon (Si) and functions as, for example, the channel area of the memory transistor. In the illustrated example, lower end portions of the semiconductor layers 120 are connected to the P-type well 102 of the semiconductor substrate S. Moreover, between the conducting layers 110 and the semiconductor layers 120, gate insulating films (not illustrated) are disposed. This gate insulating film includes, for example, an insulating electric charge accumulating film, such as silicon nitride ($Si_3N_4$), a floating gate, such as polycrystalline silicon containing impurities, or another kind of memory unit that allows recording piece of data. For example, the memory transistor has a property that changes a threshold voltage according to a state of the gate insulating film.

The inter-block structure ST includes the wiring LI that extends in the Z-direction and the X-direction and insulating layers SW, such as silicon oxide ($SiO_2$), disposed on side surfaces in the Y-direction of the wiring LI. The wiring LI contains, for example, a metal, such as tungsten (W), polycrystalline silicon (Si) into which impurities, such as phosphorus (P), are injected, silicide, a conductive material other than the substances, or the like. For example, the wiring LI is connected to an electron channel formed on an outer peripheral surface of the semiconductor layer 120 via an electron channel formed on an upper surface of the P-type well 102 and functions as a part of a source wiring that connects the memory transistor and the peripheral circuit PC.

For example, as illustrated in FIG. 4, the peripheral circuit area RP in the memory layer ML includes a plurality of gate electrodes GE of the transistors Tr and a plurality of contacts CC, CS extending in the Z-direction. The gate electrode GE is opposed to the upper surface of the semiconductor substrate S via an insulating film (not illustrated). The contacts CC, CS contain, for example, tungsten. A lower end of the contact CC is connected to the upper surface of the conducting layer 110. The contact CC functions as a wiring that connects the conducting layer 110 and the peripheral circuit. The contacts CS are connected to the upper surface of the semiconductor substrate S or the gate electrodes GE. The contact CS, for example, functions as a source electrode, a drain electrode, or a gate electrode of the transistor Tr. Between these configurations, an insulating layer 105, such as silicon oxide ($SiO_2$), is disposed.

The wiring layer MX includes a plurality of wirings mX disposed in the peripheral circuit area RP. The wiring mX contains, for example, tungsten (W) and is connected to an upper end of the contact CC or CS.

The wiring layer M0 includes a plurality of wirings m0 disposed in the peripheral circuit area RP. The wiring m0 contains, for example, tungsten (W) and is connected to an upper surface of the wiring mX via a contact c0. Note that the contact c0 contains, for example, tungsten (W) and extends in the Z-direction.

The wiring layer M1 includes a plurality of bit lines BL disposed in the memory area RM and a plurality of wirings m1 disposed in the peripheral circuit area RP. The bit line BL and the wiring m1 contain, for example, copper (Cu). The respective bit lines BL extend in the Y-direction and are connected to upper ends of the semiconductor layers 120 via contacts Vy, Ch extending in the Z-direction. Additionally, for example, the bit lines BL and the wirings m1 are connected to the upper surfaces of the wirings m0 via the contacts c1. Note that the contact c1 contains, for example, tungsten (W) and extends in the Z-direction.

The wiring layer M2 includes a plurality of wirings m2 disposed in the memory area RM and the peripheral circuit area RP. The wiring m2 contains, for example, aluminum (Al) and is connected to an upper surface of the wiring m1 via a contact c2 (FIG. 4). Among the wirings m2, the wiring m2 disposed in the bonding pad area RB (FIG. 5) functions as the bonding pad electrode P. Note that the contact c2 contains, for example, tungsten (W) and extends in the Z-direction.

[Configuration in Bonding Pad Area RB]

Figure 6:
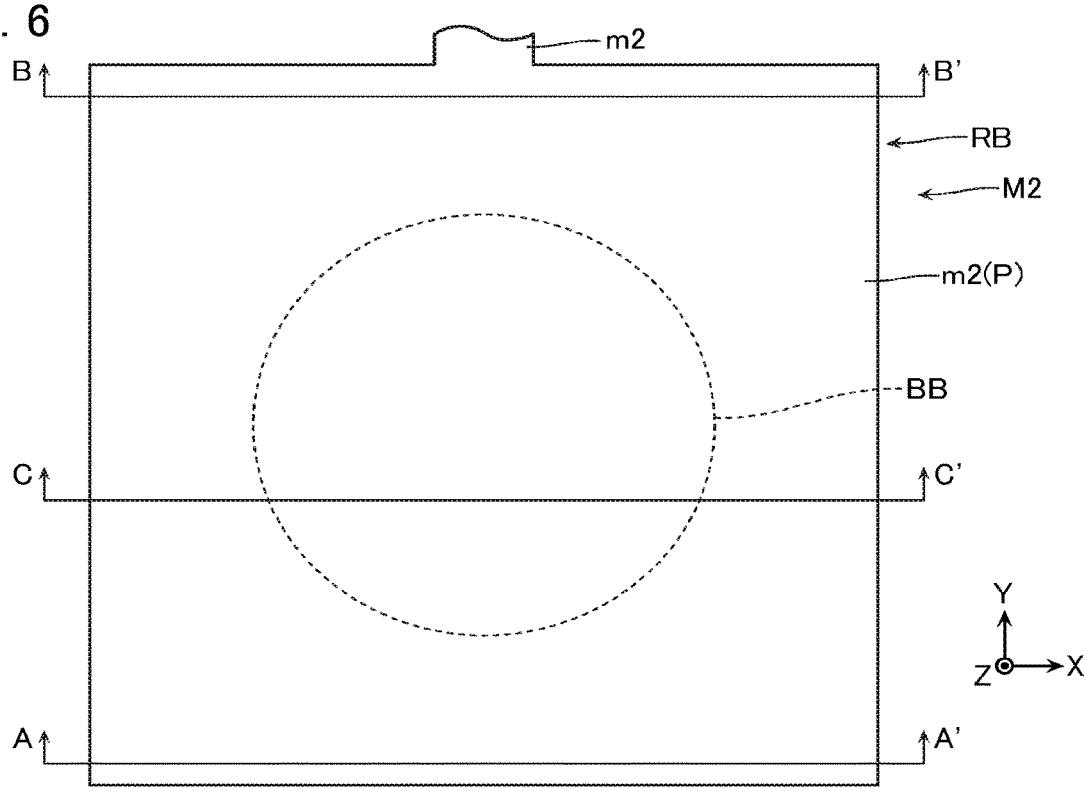
FIG. 6 is a schematic plan view illustrating a configuration of a wiring layer M2 in a bonding pad area RB.
Figure 7:
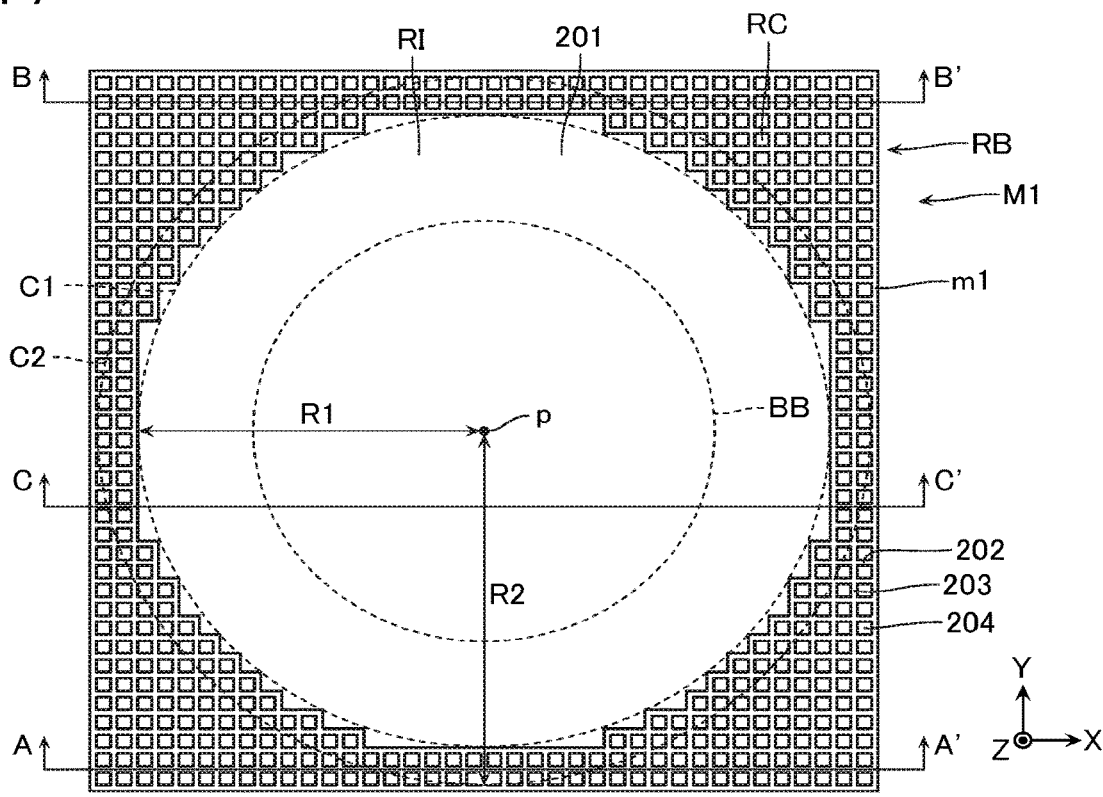
FIG. 7 is a schematic plan view illustrating a configuration of a wiring layer M1 in the bonding pad area RB.
Figure 8:
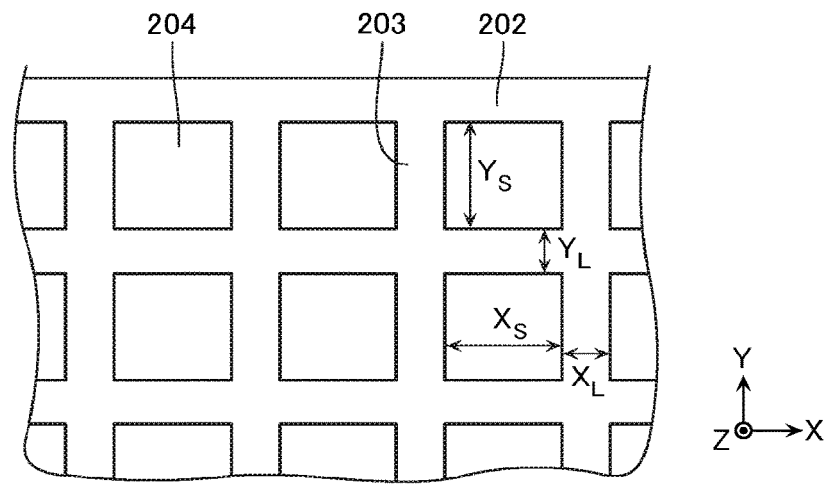
FIG. 8 is an enlarged view of a part of FIG. 7.
Figure 9:
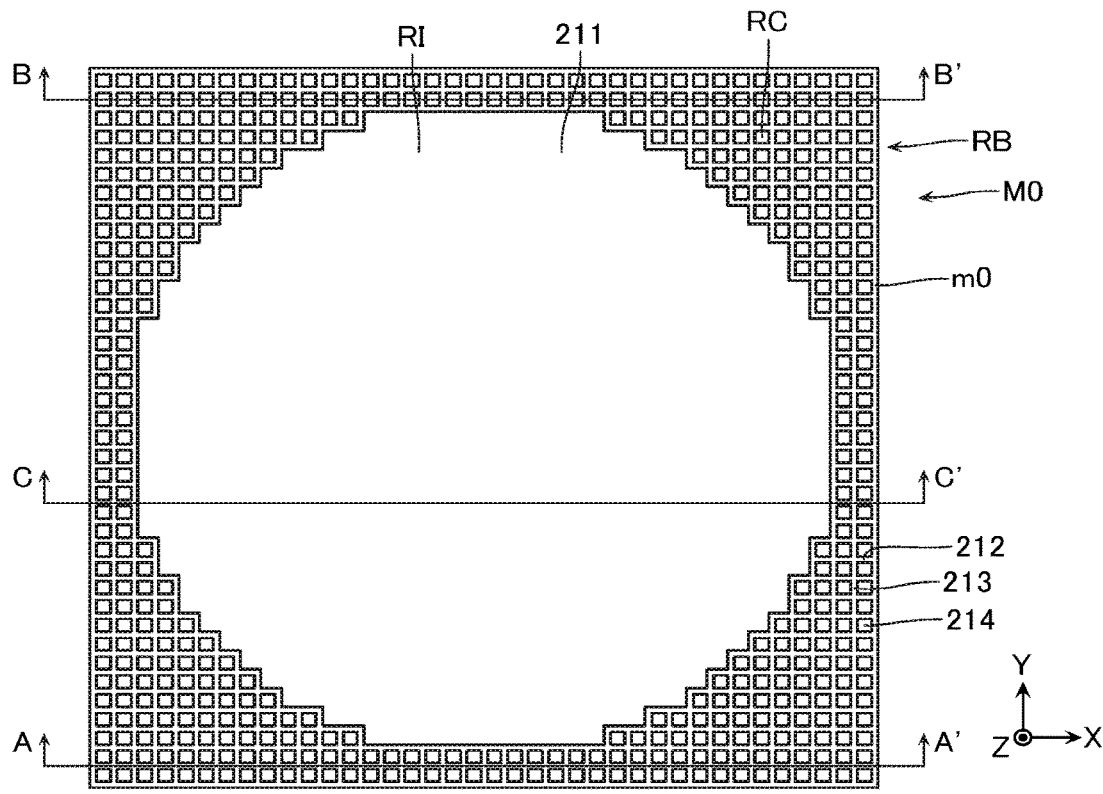
FIG. 9 is a schematic plan view illustrating a configuration of a wiring layer M0 in the bonding pad area RB.
Figure 10:
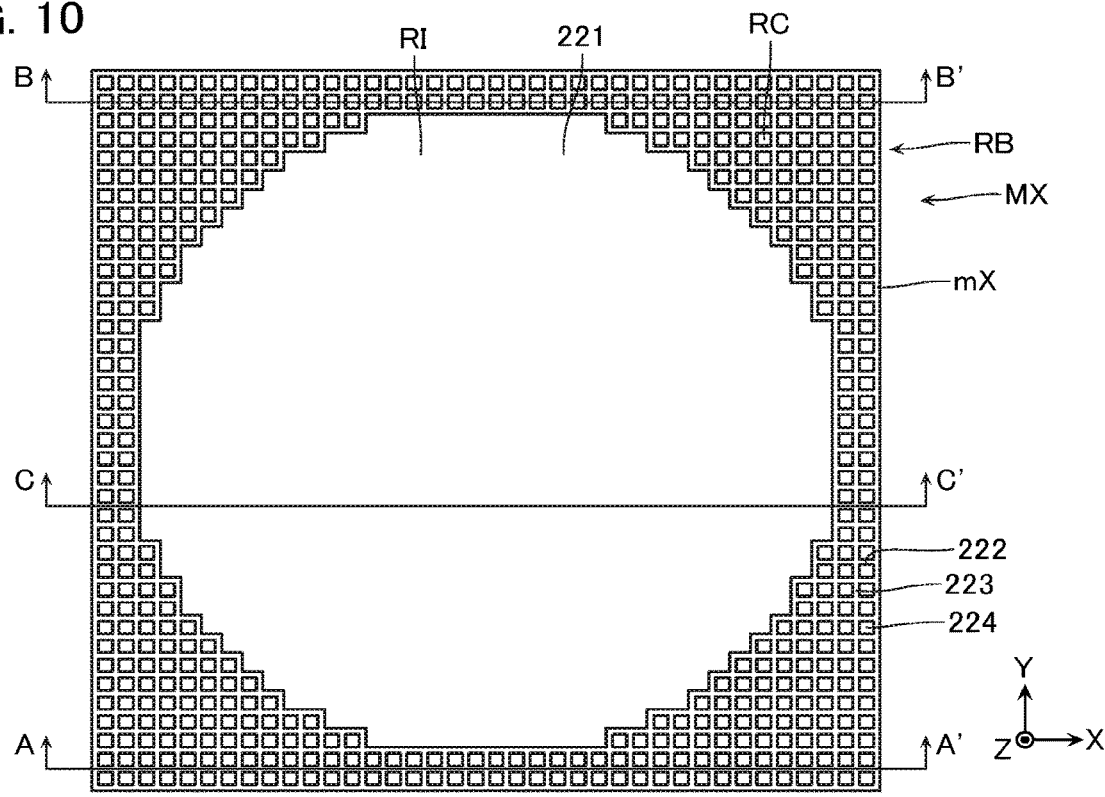
FIG. 10 is a schematic plan view illustrating a configuration of a wiring layer MX in the bonding pad area RB.
Figure 11:
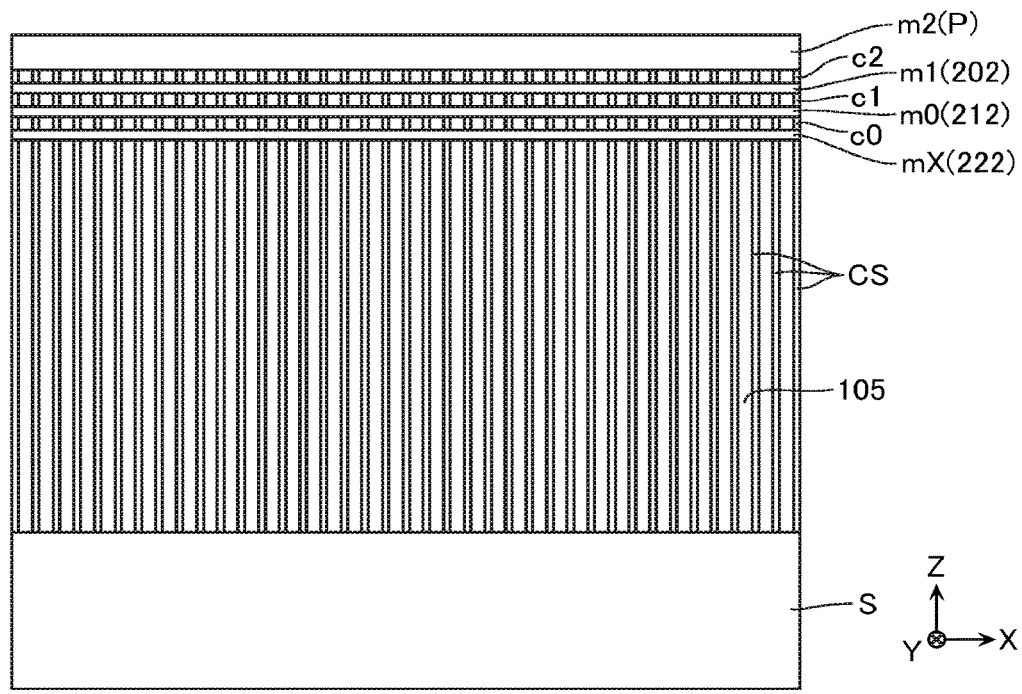
FIG. 11 is a schematic cross-sectional view taking the structure illustrated in FIG. 6, FIG. 7, FIG. 9, and FIG. 10 along the line A-A' and viewed in the arrow direction.
Figure 12:
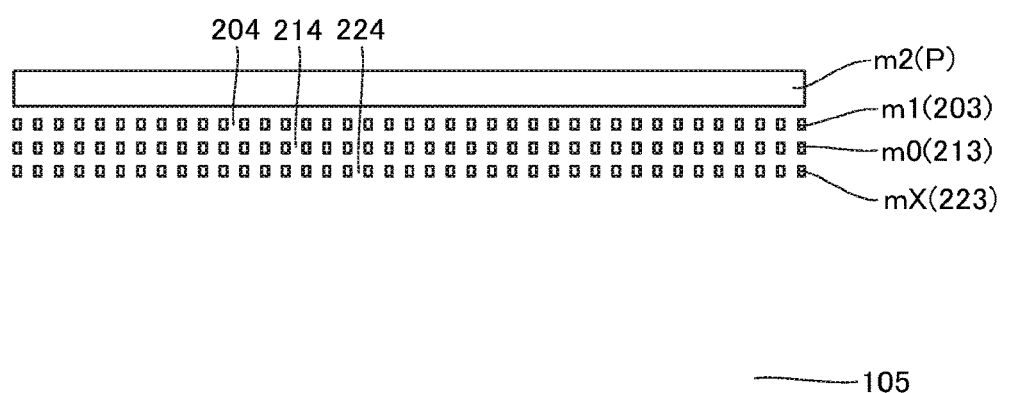
FIG. 12 is a schematic cross-sectional view taking the structure illustrated in FIG. 6, FIG. 7, FIG. 9, and FIG. 10 along the line B-B' and viewed in the arrow direction.
Figure 12:
Figure 13:
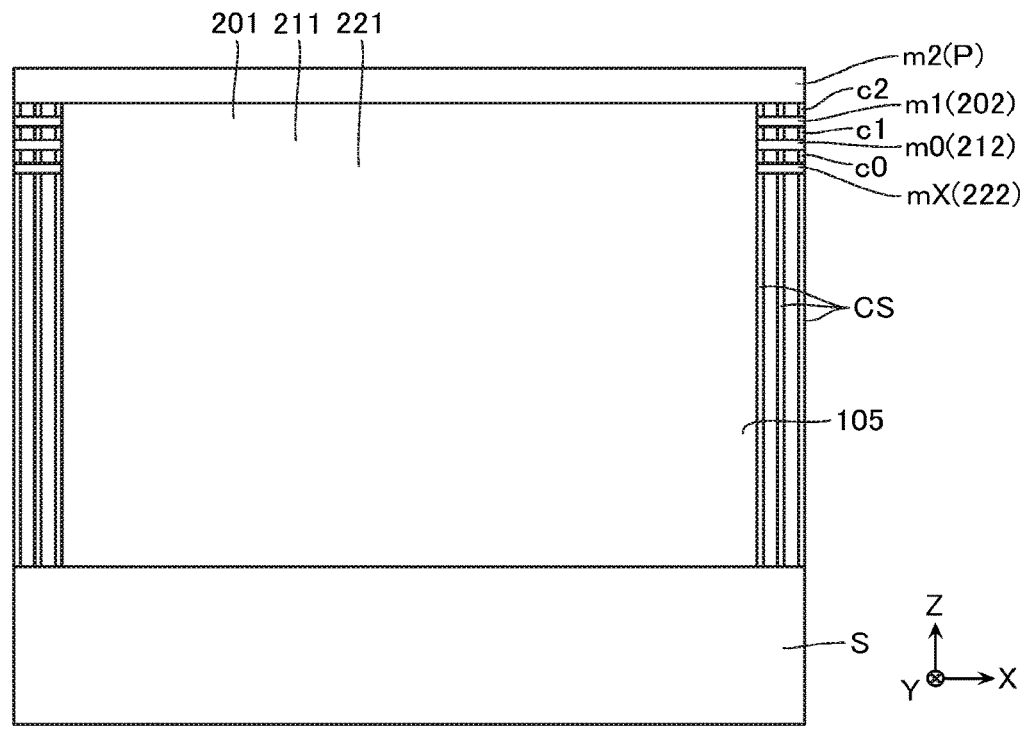
FIG. 13 is a schematic cross-sectional view taking the structure illustrated in FIG. 6, FIG. 7, FIG. 9, and FIG. 10 along the line C-C' and viewed in the arrow direction.

Next, with reference to FIG. 6 to FIG. 13, a configuration of the semiconductor memory device according to the first configuration in the bonding pad area RB will be described. FIG. 6 is a schematic plan view illustrating a configuration of the wiring layer M2 in the bonding pad area RB. FIG. 7 is a schematic plan view illustrating a configuration of the wiring layer M1 in the bonding pad area RB. FIG. 8 in an enlarged view of a part of FIG. 7. FIG. 9 is a schematic plan view illustrating a configuration of the wiring layer M0 in the bonding pad area RB. FIG. 10 is a schematic plan view illustrating a configuration of the wiring layer MX in the bonding pad area RB. FIG. 11 is a schematic cross-sectional view taking the structure illustrated in FIG. 6, FIG. 7, FIG. 9, and FIG. 10 along the line A-A' and viewed in the arrow direction. FIG. 12 is a schematic cross-sectional view taking the structure illustrated in FIG. 6, FIG. 7, FIG. 9, and FIG. 10 along the line B-B' and viewed in the arrow direction. FIG. 13 is a schematic cross-sectional view taking the structure illustrated in FIG. 6, FIG. 7, FIG. 9, and FIG. 10 along the line C-C' and viewed in the arrow direction.

As illustrated in FIG. 6, the bonding pad electrode P is disposed in the bonding pad area RB in the wiring layer M2. The bonding pad electrode P is an electrode having an approximately rectangular shape disposed in the wiring layer M2. For example, the bonding pad electrode P is connected to the transistor Tr, which is disposed in another area in the peripheral circuit area RP, via another wiring m2 extending in the Y-direction. An area BB having an approximately circular shape indicated by the dotted line in FIG. 6 illustrates an area corresponding to a contact surface between the bonding pad electrode P and the bonding wire B.

As illustrated in FIG. 7, the bonding pad area RB in the wiring layer M1 includes an insulating area RI having an approximately circular shape and a conducting area RC having an approximately rectangular shape that surrounds this insulating area RI having the approximately circular shape. The insulating area RI is, for example, an area embedded with an insulating layer 201, such as silicon oxide ($SiO_2$), and an area not including, for example, a conducting member. The area BB corresponding to the contact surface between the bonding pad electrode P and the bonding wire B is disposed inside the insulating area RI. The conducting area RC includes, for example, a plurality of conducting members 202 extending in the X-direction and arranged in the Y-direction and a plurality of conducting members 203 extending in the Y-direction and arranged in the X-direction. The conducting members 202, 203 are a part of the plurality of wirings m1 described above. Insulating layers 204, such as silicon oxide ($SiO_2$), are disposed between the conducting members 202, 203.

Note that in the example of FIG. 7, an inside of a circle C1 with a radius R1 around a point p is the insulating area RI. Further, an outside of a circle C2 with a radius R2 (>R1) around the point p is the conducting area RC. A boundary between the insulating area RI and the conducting area RC is provided at an area outside the circle C1 and inside the circle C2. The circle C1 may be, for example, an inscribed circle of a boundary line between the insulating area RI and the conducting area RC. The circle C2 may be, for example, a circumscribed circle of the boundary line between the insulating area RI and the conducting area RC. Note that the above-described area BB is disposed inside the circle C1.

FIG. 8 illustrates an example in which a ratio of a width $Y_L$ in the Y-direction of the conducting member 202 to an interval $Y_S$ in the Y-direction of the conducting member 202 is around 1:3. Additionally, FIG. 8 illustrates an example in which a ratio of a width $X_L$ in the X-direction of the conducting member 203 to an interval $X_S$ in the X-direction of the conducting member 203 is around 1:3. However, the ratios are appropriately adjustable. For example, the ratios may be around 10:1 to 1:10. More preferably, it is considered that the ratios are set to be around 4:1 to 1:4. Furthermore, the ratio between $Y_L$ and $Y_S$ may differ from the ratio between $X_L$ and $X_S$.

As illustrated in FIG. 9, in the bonding pad area RB in the wiring layer M0, a structure similar to the structure in the bonding pad area RB in the wiring layer M1 is disposed. In the example of FIG. 9, the insulating area RI in the wiring layer M0 is embedded with an insulating layer 211, such as silicon oxide ($SiO_2$). In the example in FIG. 9, the conducting area RC in the wiring layer M0 includes, for example, a plurality of conducting members 212 extending in the X-direction and arranged in the Y-direction and a plurality of conducting members 213 extending in the Y-direction and arranged in the X-direction. The conducting members 212, 213 are a part of the plurality of wirings m0 described above. Insulating layers 214, such as silicon oxide ($SiO_2$), are disposed between the conducting members 212, 213.

As illustrated in FIG. 10, in the bonding pad area RB in the wiring layer MX, a structure similar to the structure in the bonding pad area RB in the wiring layer M1 is disposed. In the example of FIG. 10, the insulating area RI in the wiring layer MX is embedded with an insulating layer 221, such as silicon oxide ($SiO_2$). In the example of FIG. 10, the conducting area RC in the wiring layer MX includes, for example, a plurality of conducting members 222 extending in the X-direction and arranged in the Y-direction and a plurality of conducting members 223 extending in the Y-direction and arranged in the X-direction. The conducting members 222, 223 are a part of the plurality of wirings mX described above. Insulting layers 224, such as silicon oxide ($SiO_2$), are disposed between the conducting members 222, 223.

As illustrated in FIG. 11, the contacts c2 are disposed at respective intersecting parts of the conducting members 202, 203 in the wiring layer M1. The contacts c1 are disposed at respective intersecting parts of the conducting members 202, 203 in the wiring layer M1. The contacts c0 are disposed at respective intersecting parts of the conducting members 212, 213 in the wiring layer M0. Additionally, the contacts CS are disposed at respective intersecting parts of the conducting members 222, 223 in the wiring layer MX. The bonding pad electrodes P are connected to the upper surface of the semiconductor substrate S via these configurations.

As illustrated in FIG. 12, the insulating layers 204 in the wiring layer M1, the insulating layers 214 in the wiring layer M0, and the insulating layers 224 in the wiring layer MX are arranged in the Z-direction and connected to one another without via, for example, a metal wiring. Additionally, the insulating layers 224 are connected to the insulating layer 105. Note that insulating layers, such as silicon nitride ($Si_3N_4$), may be disposed between these insulating layers 204, 214, 224, 105.

As illustrated in FIG. 13, the insulating layer 201 in the wiring layer M1, the insulating layer 211 in the wiring layer M0, and the insulating layer 221 in the wiring layer MX are arranged in the Z-direction and connected to one another without via, for example, a metal wiring. Additionally, the insulating layer 221 is connected to the insulating layer 105. Note that insulating layers, such as silicon nitride ($Si_3N_4$), may be disposed between these insulating layers 201, 211, 221, 105.

[Second Configuration]

Figure 14:
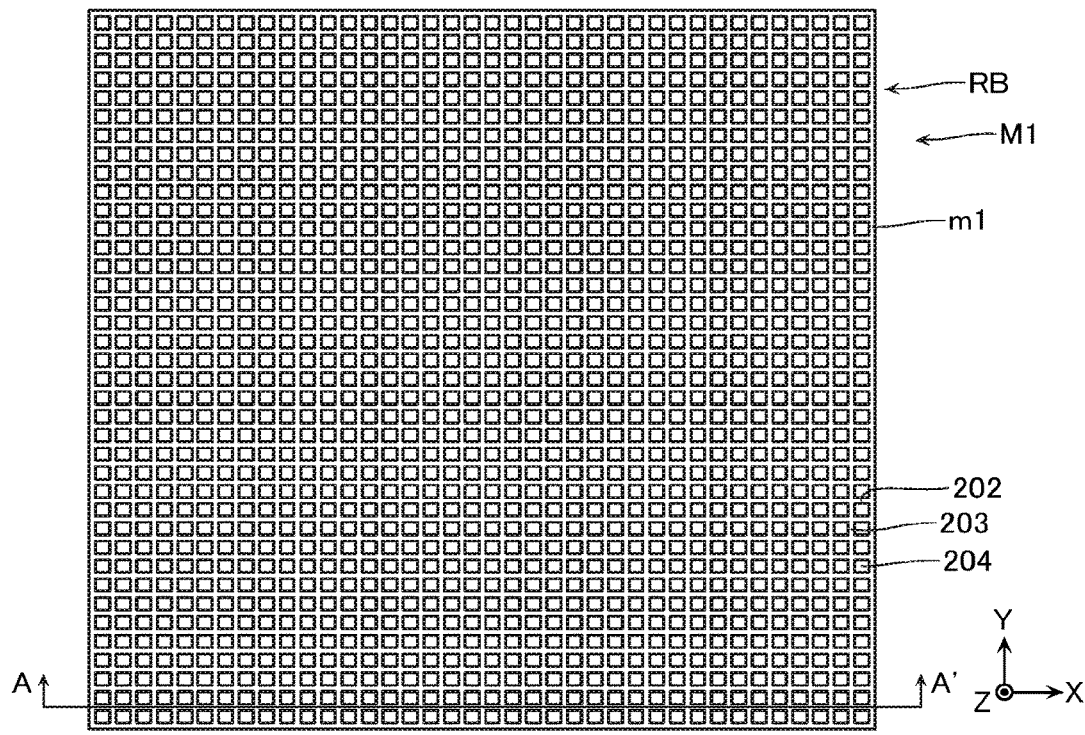
FIG. 14 is a schematic plan view illustrating a configuration of the wiring layer M1 in the bonding pad area RB in a semiconductor memory device according to a second configuration.
Figure 15:
FIG. 15 is a schematic cross-sectional view taking the structure illustrated in FIG. 14 along the line A-A' and viewed in the arrow direction.
Figure 15:

Next, with reference to FIG. 14 and FIG. 15, a configuration of a semiconductor memory device according to the second configuration will be described. The semiconductor memory device according to the second configuration is configured basically similarly to the semiconductor memory device according to the first configuration. However, as exemplified in FIG. 14, the semiconductor memory device according to the second configuration does not include the insulating areas RI in the wiring layers MX, M0, M1. As exemplified in FIG. 15, in the semiconductor memory device according to the second configuration, the contacts CS, c0, c1, c2 are absent in the bonding pad area RB.

In such a configuration, the wirings mX, m0, m1 are disposed in the wiring layers MX, M0, M1. Therefore, dishing in the bonding pad area RB can be reduced in a manufacturing process.

[Third Configuration]

Next, a configuration of a semiconductor memory device according to the third configuration will be described. The semiconductor memory device according to the third configuration is configured basically similarly to the semiconductor memory device according to the second configuration. However, as exemplified in FIG. 11, in the semiconductor memory device according to the third configuration, the contacts CS, c0, c1, c2 are disposed in the bonding pad area RB, similarly to the first configuration.

In such a configuration, the wirings mX, m0, m1 are disposed in the wiring layers MX, M0, M1. These wirings mX, m0, m1 are connected to the semiconductor substrate S via the contacts CS, c0, c1, c2. Therefore, an electric charge accumulated to the wirings mX, m0, m1 is discharged via the semiconductor substrate S. Thus, the accumulation of the electric charge to the wirings mX, m0, m1 and dielectric breakdown in association with the accumulation of the electric charge can be reduced.

[Fourth Configuration]

Figure 16:
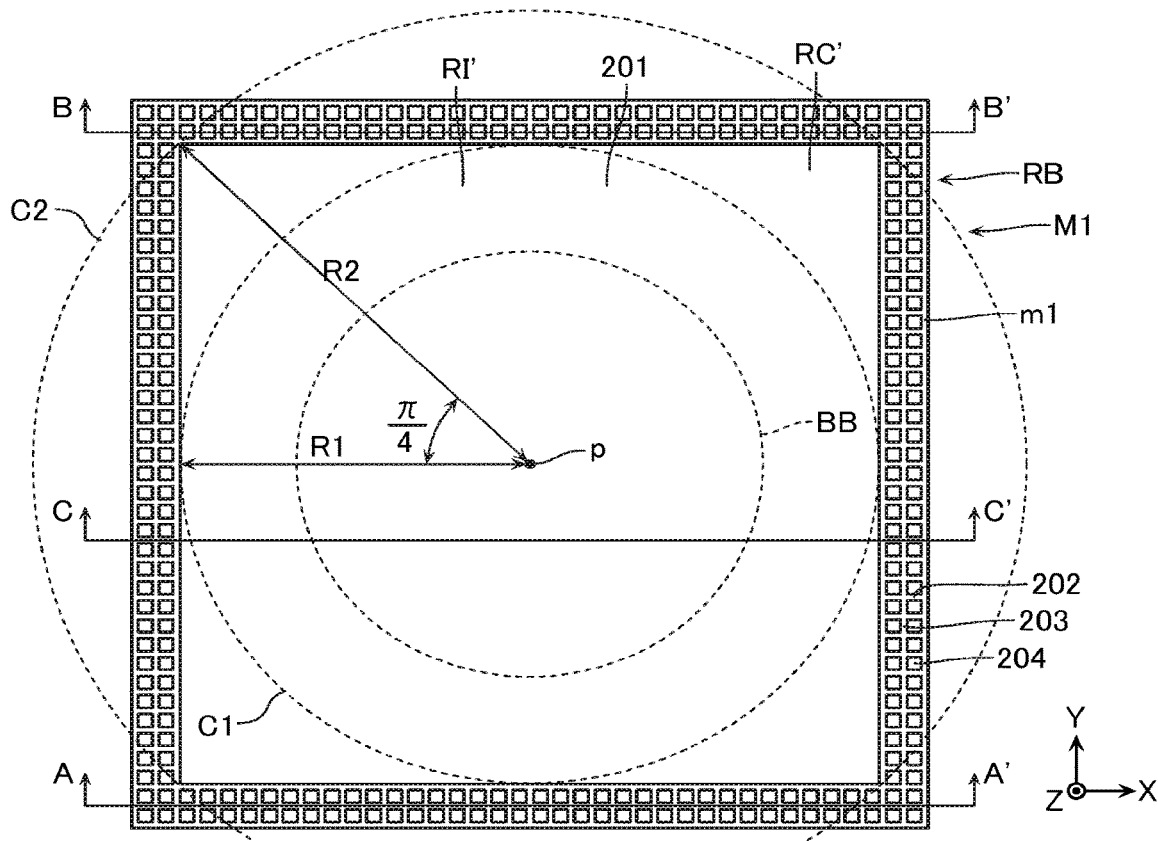
FIG. 16 is a schematic plan view illustrating a configuration of the wiring layer M1 in the bonding pad area RB in a semiconductor memory device according to a fourth configuration.

Next, with reference to FIG. 16, a configuration of a semiconductor memory device according to the fourth configuration will be described. The semiconductor memory device according to the fourth configuration is configured basically similarly to the semiconductor memory device according to the first configuration. However, as described with reference to FIG. 7, FIG. 9, and FIG. 10, in the first configuration, the insulating areas RI having the approximately circular shape are disposed in the wiring layers MX, M0, M1. Meanwhile, as exemplified in FIG. 16, in the semiconductor memory device according to the fourth configuration, rectangular-shaped insulating areas RI' are disposed in the wiring layers MX, M0, M1. The area BB corresponding to the contact surface between the bonding pad electrode P and the bonding wire B is disposed inside the insulating area RI'.

Here, when the bonding wire B is installed to the bonding pad electrode P, the bonding pad electrode P is pushed downward by a capillary. In this respect, stress is also applied to the wirings mX, m0, m1 and the contacts c0, c1, c2 via the bonding pad electrodes P. Here, when stress is applied to the contact c1 in the example in which the contact c1 contains, for example, tungsten (W), which is comparatively hard, the stress is concentrated on the insulating layers, such as silicon oxide ($SiO_2$), disposed between the plurality of contacts c1, and a crack possibly occurs in the insulating layer. In a case where the capillary moves upward in the state, there is a possibility that a part of the structure including the bonding pad electrode P is pulled off from the substrate S together with the bonding wire B.

Therefore, in the semiconductor memory device according to the fourth configuration, the wirings mX, m0, m1 are absent in the area BB corresponding to the contact surface between the bonding pad electrodes P and the bonding wire B, and the contacts c0, c1, c2 are absent as well. With the configuration, pulling-off of the bonding pad electrode P as described above can be reduced.

[Effects of First Configuration]

As described with reference to FIG. 7, FIG. 9, and FIG. 10, in the semiconductor memory device according to the first configuration, the bonding pad area RB in the wiring layer MX, M0, M1 includes the insulating area RI having the approximately circular shape and the conducting area RC having the approximately rectangular shape that surrounds this insulating area RI having the approximately circular shape. The area BB corresponding to the contact surface between the bonding pad electrode P and the bonding wire B is disposed inside the insulating area RI.

In the configuration, the wirings mX, m0, m1 are absent in the area BB corresponding to the contact surface between the bonding pad electrode P and the bonding wire B, and the contacts c0, c1, c2 are absent as well. Therefore, pulling-off of the bonding pad electrode P as described above can be reduced. Moreover, since the insulating area RI is configured to have the approximately circular shape and the conducting area RC surrounds this insulating area RI having the approximately circular shape, an amount of metal wirings can be increased more than that of the fourth configuration illustrated in FIG. 16. Accordingly, dishing can be more preferably reduced compared with the fourth configuration.

[Other Configurations and the Like of First Embodiment]

In the example described with reference to FIG. 6 to FIG. 13, the conducting members 202, 203 are disposed in the conducting area RC in the wiring layer M1. However, at least one of the conducting members 202, 203 only need to be disposed in the conducting area RC in the wiring layer M1. Additionally, only conducting members may be disposed in the entire conducting area RC in the wiring layer M1, and the insulating layers 204 need not to be disposed. For example, the conducting layers may be disposed in the entire conducting area RC in the wiring layer M1, and the insulating layers 204 need not to be disposed. That is, so-called solid films may be disposed in the conducting area RC in the wiring layer M1. The same applies to the conducting area RC in the wiring layer M0 and the conducting area RC in the wiring layer MX.

Additionally, the radius R1 of the circle C1 in FIG. 7 is appropriately adjustable. The radius R1 of the circle C1 is preferably set considering, for example, a size of a wiring portion or a ball portion included in the bonding wire B and a variation of positions of the contact surfaces. For example, the radius R1 of the circle C1 may be around 30 μm. Note that a diameter of the circle C1 may be equal to or more than the width in the X-direction or the width in the Y-direction of the bonding pad electrode P. In this case, for example, the conducting area RC may be separated into a plurality of areas.

Figure 17:
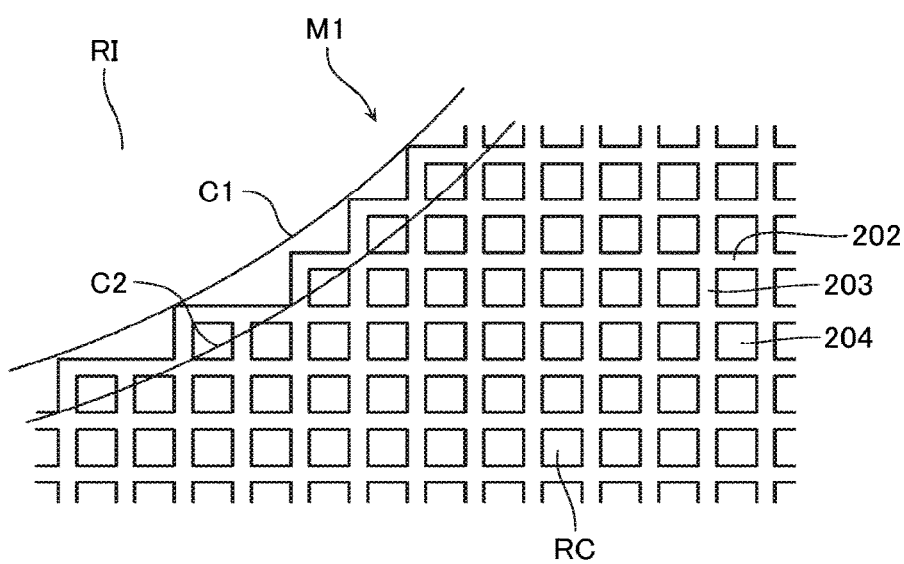
FIG. 17 is a schematic plan view illustrating an exemplary configuration of a part of the semiconductor memory device according to the first embodiment.
Figure 18:
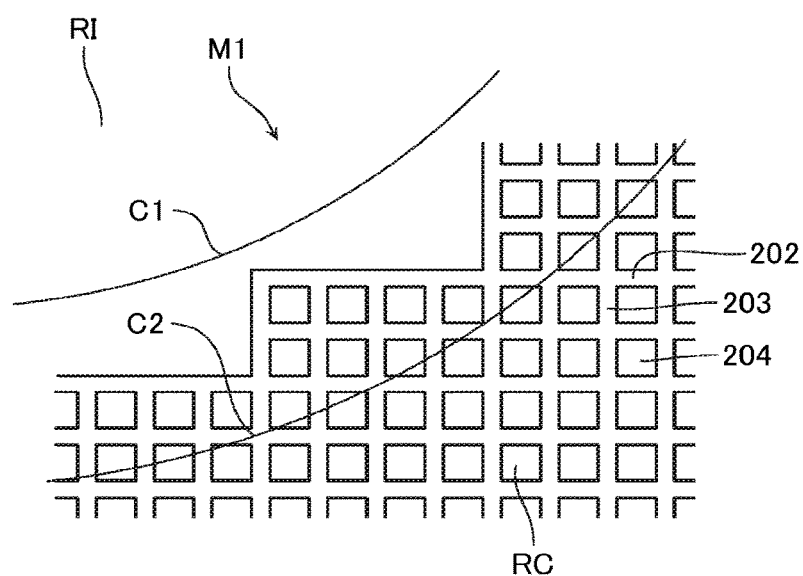
FIG. 18 is a schematic plan view illustrating an exemplary configuration of a part of the semiconductor memory device according to the first embodiment.

Moreover, the radius R2 of the circle C2 in FIG. 7 is appropriately adjustable. For example, in the example illustrated in FIG. 7, the radius R2 of the circle C2 has the size approximately similar to the radius R1 of the circle C1. In such an aspect, dishing can be preferably reduced. For example, as illustrated in FIG. 17, in the wiring layer M1, a shape of the boundary between the insulating area RI and the conducting area RC may be adjusted according to wiring patterns of the conducting members 202, 203 such that the radius R2 of the circle C2 is close to the radius R1 of the circle C1 as much as possible. Additionally, for example, as illustrated in FIG. 18, in the wiring layer M1, the shape of the boundary between the insulating area RI and the conducting area RC may be adjusted such that the radius R2 of the circle C2 differs from the radius R1 of the circle C1 to some extent.

Figure 19:
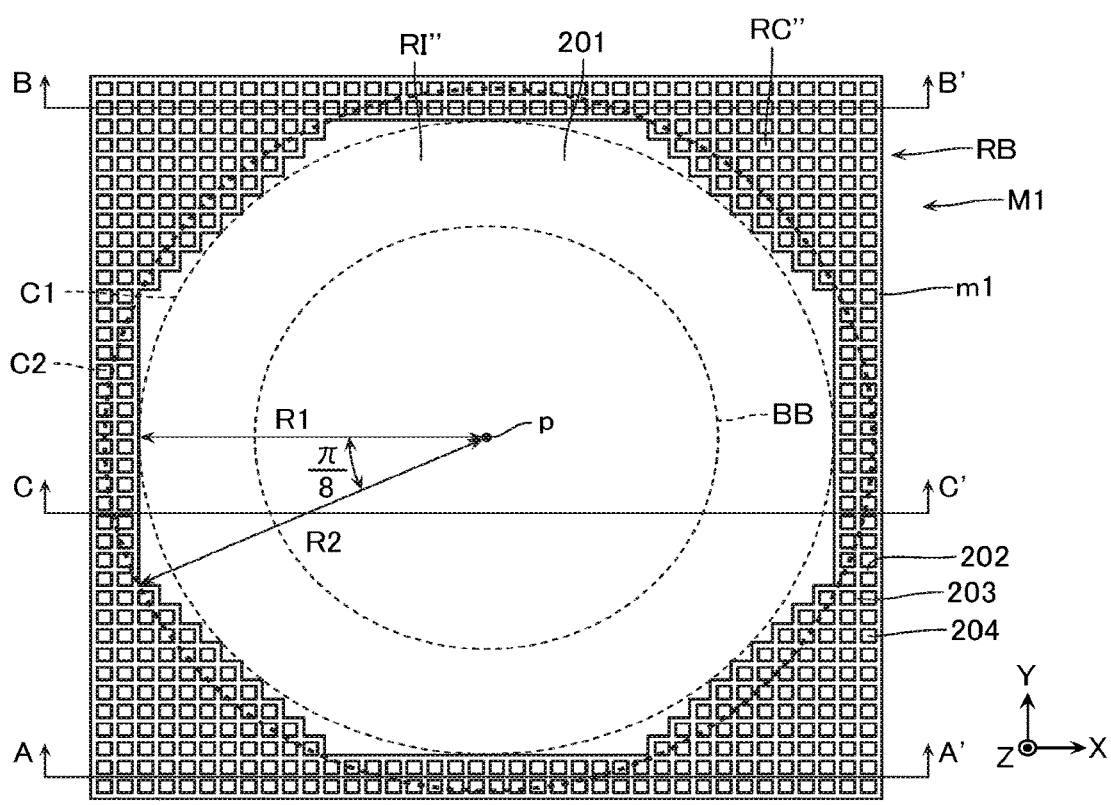
FIG. 19 is a schematic plan view illustrating another exemplary configuration of the semiconductor memory device according to the first embodiment.

For example, in the example illustrated in FIG. 19, an insulating area RI" is configured to have an approximately octagon shape. This aspect also allows preferably reducing dishing sufficiently. In this case, a relationship R1=R2 cos($\pi$/8) is met. Therefore, in the range where the size of the radius R2 becomes R1 (1/cos($\pi$/8)) or less (about 1.08×R1 or less), dishing can be preferably reduced sufficiently. For example, in the fourth configuration described with reference to FIG. 16, the insulating area RI' is configured to have a square shape. Here, in the fourth configuration, a relationship R1=R2 cos($\pi$/4) is met. When the size of the radius R2 is less than R1 (1/cos($\pi$/4)) (less than R1×root 2), dishing can be especially preferably reduced.

Second Embodiment

Figure 20:
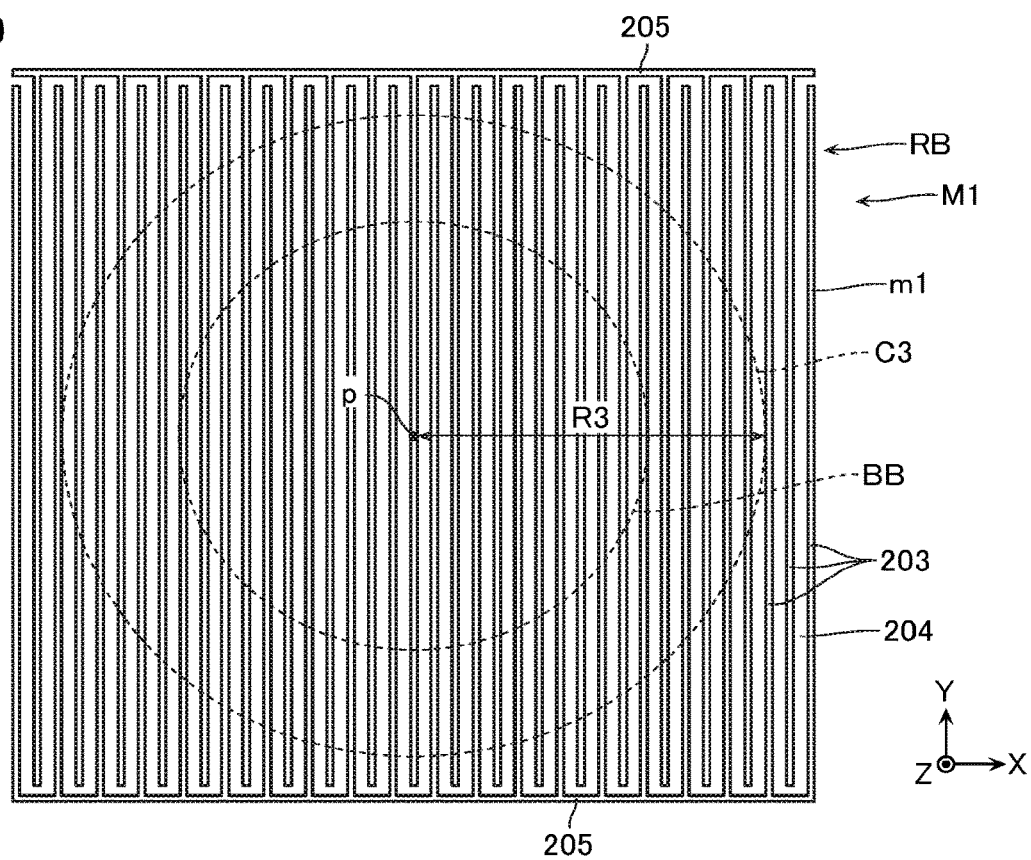
FIG. 20 is a schematic plan view illustrating a configuration of the wiring layer M1 in the bonding pad area RB in a semiconductor memory device according to a second embodiment.

Next, with reference to FIG. 20 to FIG. 22, a semiconductor memory device according to the second embodiment will be described. The semiconductor memory device according to the second embodiment is basically configured similarly to the semiconductor memory device according to the first embodiment. However, the semiconductor memory device according to the second embodiment differs from the semiconductor memory device according to the first embodiment in a part of the configuration in the bonding pad area RB.

That is, for example, in the example described with reference to FIG. 7, the insulating area RI having the approximately circular shape is disposed in the bonding pad area RB in the wiring layer M1. Meanwhile, as illustrated in FIG. 20, the insulating area RI is absent in the bonding pad area RB in the wiring layer M1 according to the second embodiment. For example, in the example described with reference to FIG. 7, in the bonding pad area RB in the wiring layer M1, the plurality of conducting members 202 extending in the X-direction and arranged in the Y-direction and the plurality of conducting members 203 extending in the Y-direction and arranged in the X-direction are disposed. Meanwhile, as illustrated in FIG. 20, the conducting members 202 are absent in the bonding pad area RB in the wiring layer M1 according to the second embodiment, but only the conducting members 203 are disposed. Additionally, between the conducting members 203, the insulating layers 204, such as silicon oxide (SiO$_2$), extending in the Y-direction are disposed. Further, one end portion or the other end portion in the Y-direction of the conducting member 203 is connected to a conducting member 205 extending in the X-direction. Note that the conducting member 205 is a part of the plurality of wirings m1.

Figure 21:
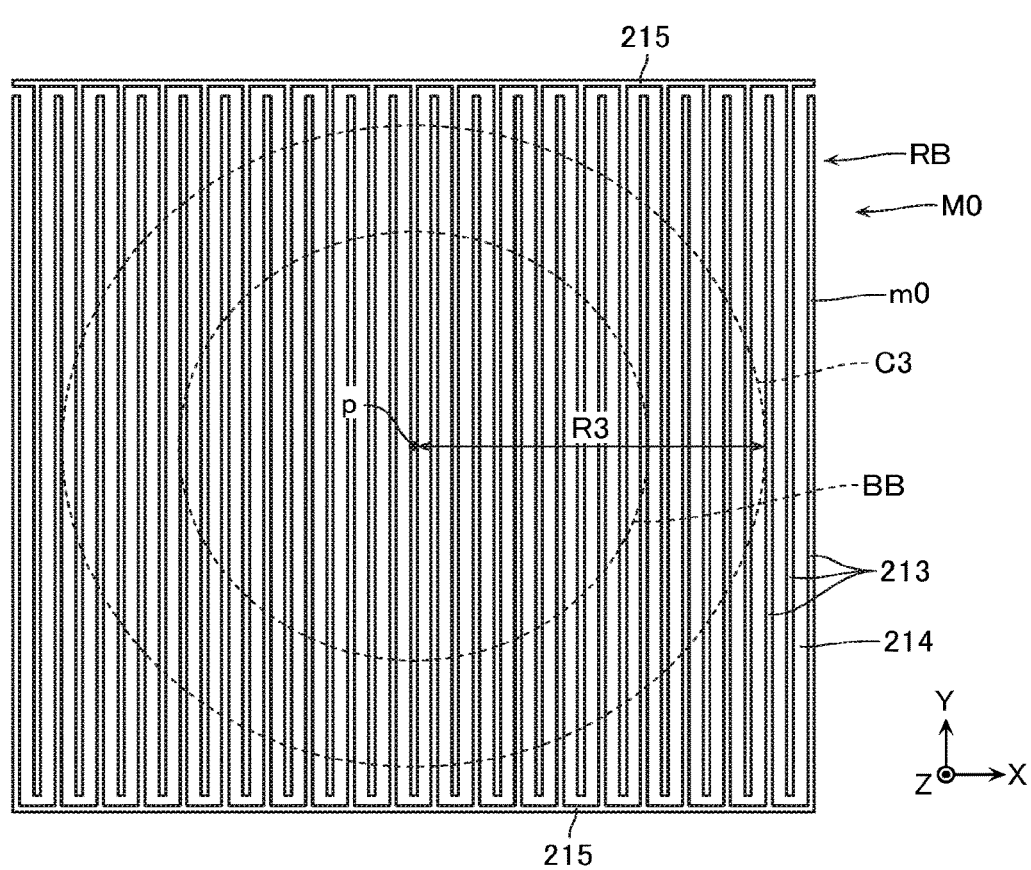
FIG. 21 is a schematic plan view illustrating a configuration of the wiring layer M0 in the bonding pad area RB in the semiconductor memory device.
Figure 22:
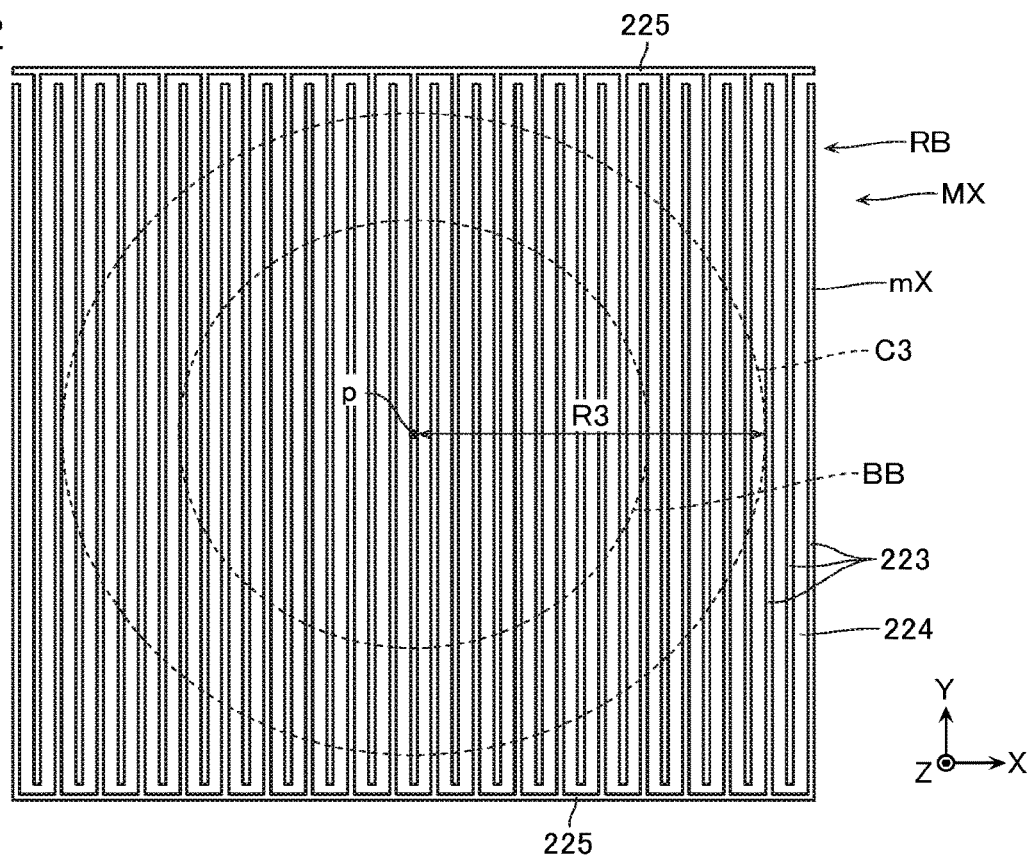
FIG. 22 is a schematic plan view illustrating a configuration of the wiring layer MX in the bonding pad area RB in the semiconductor memory device.

As illustrated in FIG. 21 and FIG. 22, in the bonding pad area RB in the wiring layer MX, M0 according to the second embodiment, a structure similar to the structure in the bonding pad area RB in the wiring layer M1 according to the second embodiment is disposed.

Further, in the bonding pad area RB in the semiconductor memory device according to the second embodiment, an arrangement density of the contacts c1 inside a circle C3 with a radius R3 around the point p is lower than an arrangement density of the contacts c1 outside the circle C3. Note that, the area BB corresponding to the contact surface between the bonding pad electrode P and the bonding wire B is disposed inside the circle C3. The radius R3 of the circle C3 is, for example, adjustable with the aspect similar to the radius R1 of the circle C1.

[Other Exemplary Configurations and the Like of Second Embodiment]

Figure 23:
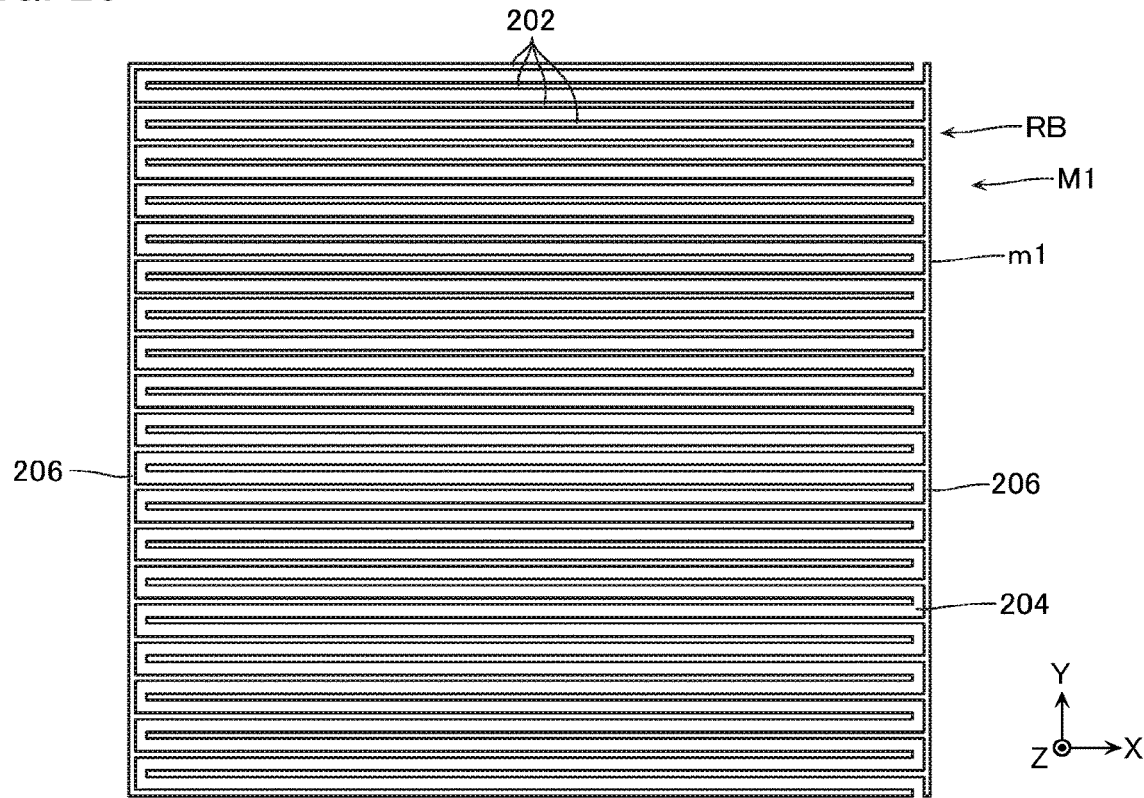
FIG. 23 is a schematic plan view illustrating a configuration of the wiring layer M1 in the bonding pad area RB of another exemplary configuration of the semiconductor memory device according to the second embodiment.

In the example described with reference to FIG. 20 to FIG. 22, the conducting members 202 are absent in the bonding pad area RB in the wiring layer M1, but only the conducting members 203 are disposed. However, for example, as illustrated in FIG. 23, the conducting members 203 may be absent in the bonding pad area RB in the wiring layer M1 but only the conducting members 202 may be disposed. In the example of FIG. 23, the insulating layers 204, such as silicon oxide (SiO$_2$), extending in the X-direction are disposed between the conducting members 202. Moreover, one end portion or the other end portion in the X-direction of the conducting member 202 is connected to a conducting member 206 extending in the Y-direction. Note that the conducting member 206 is apart of the plurality of wirings m1.

Figure 24:
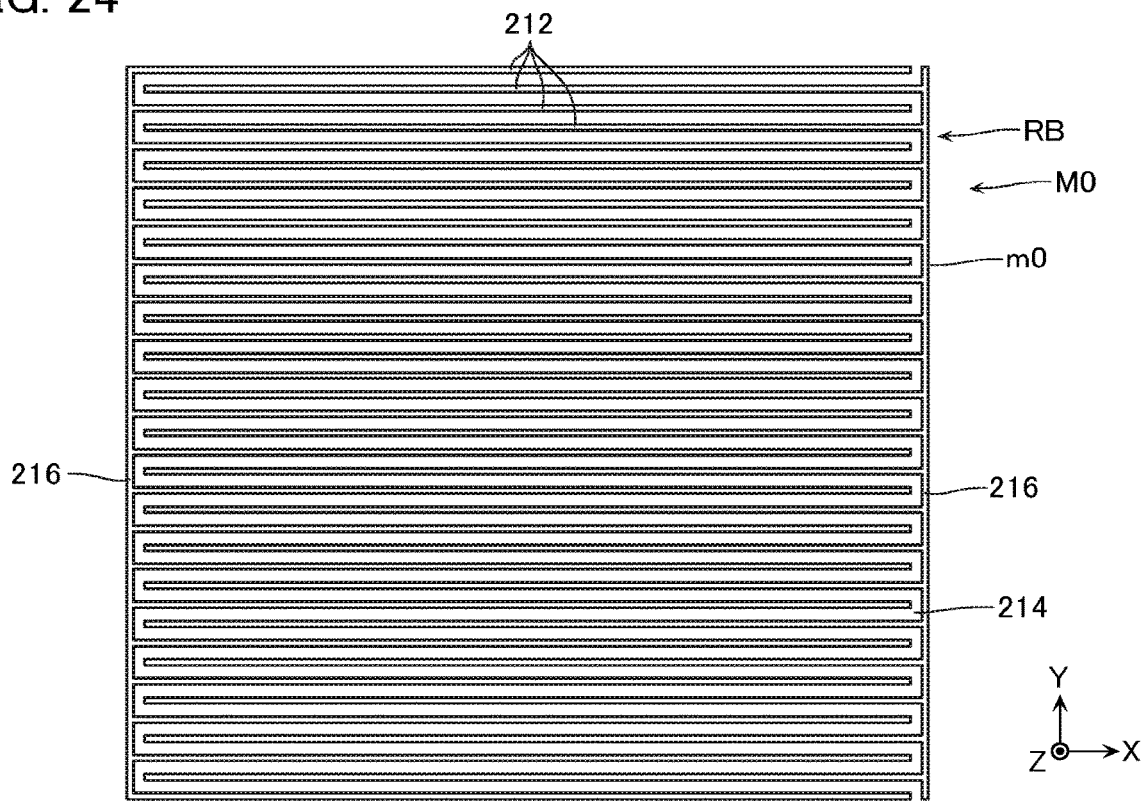
FIG. 24 is a schematic plan view illustrating a configuration of the wiring layer M0 in the bonding pad area RB of the exemplary configuration.
Figure 25:
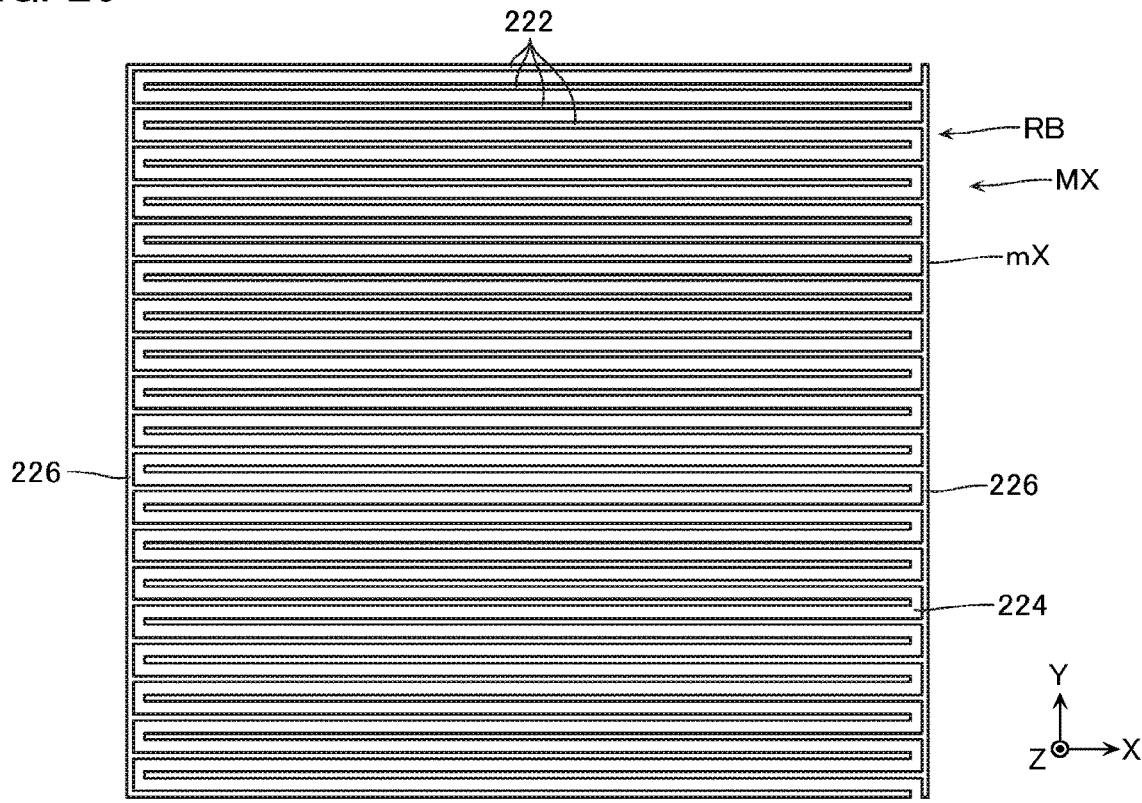
FIG. 25 is a schematic plan view illustrating a configuration of the wiring layer MX in the bonding pad area RB of the exemplary configuration.

As illustrated in FIG. 24 and FIG. 25, in the structure in the bonding pad area RB in the wiring layer MX, M0, a structure similar to the structure in FIG. 23 may be disposed.

Figure 26:
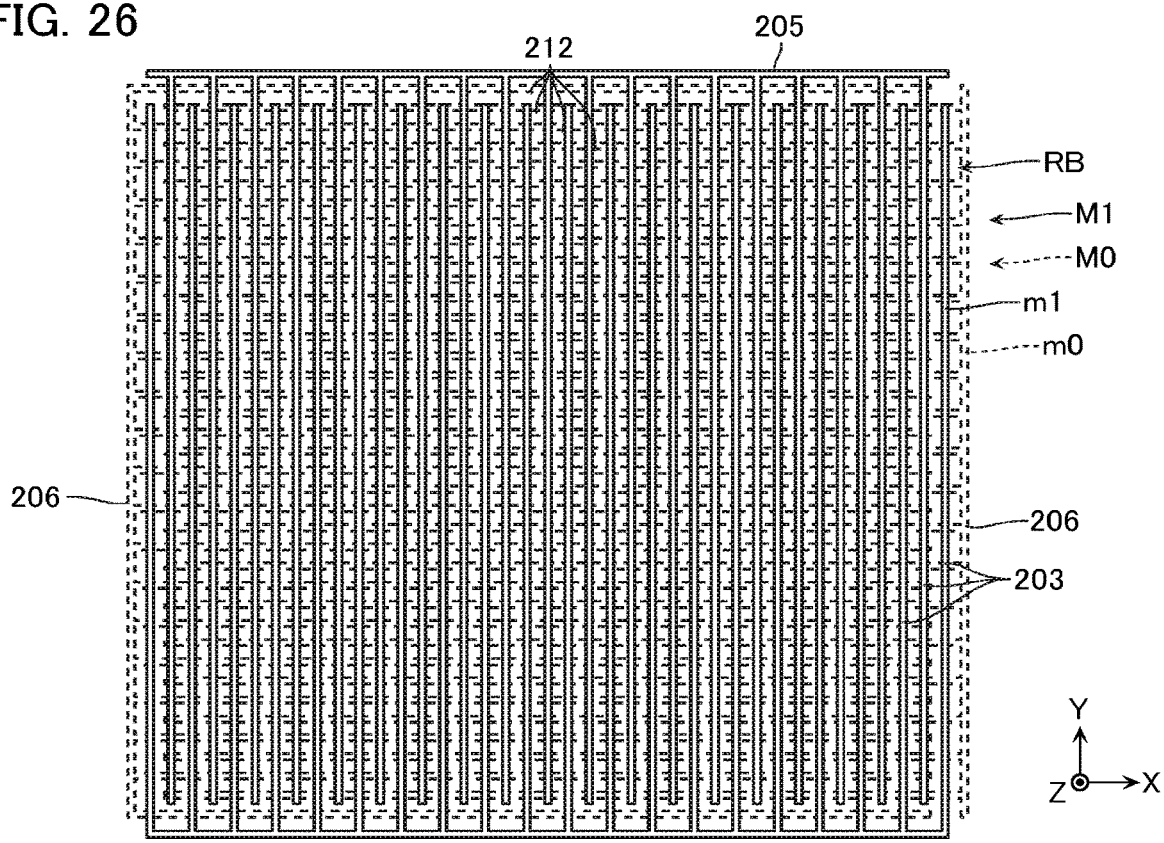
FIG. 26 is a schematic plan view illustrating a configuration in the bonding pad area RB of another exemplary configuration of the semiconductor memory device according to the second embodiment.

Additionally, for example, the structure described with reference to FIG. 20 to FIG. 22 may be combined with the structure described with reference to FIG. 23 to FIG. 25. For example, as exemplified in FIG. 26, the structure described with reference to FIG. 20 may be employed to the wiring layer M1, the structure described with reference to FIG. 24 may be employed to the wiring layer M0, and the structure described with reference to FIG. 22 may be employed to the wiring layer MX. Similarly, for example, the structure described with reference to FIG. 23 may be employed to the wiring layer M1, the structure described with reference to FIG. 21 may be employed to the wiring layer M0, and the structure described with reference to FIG. 25 may be employed to the wiring layer MX.

Figure 27:
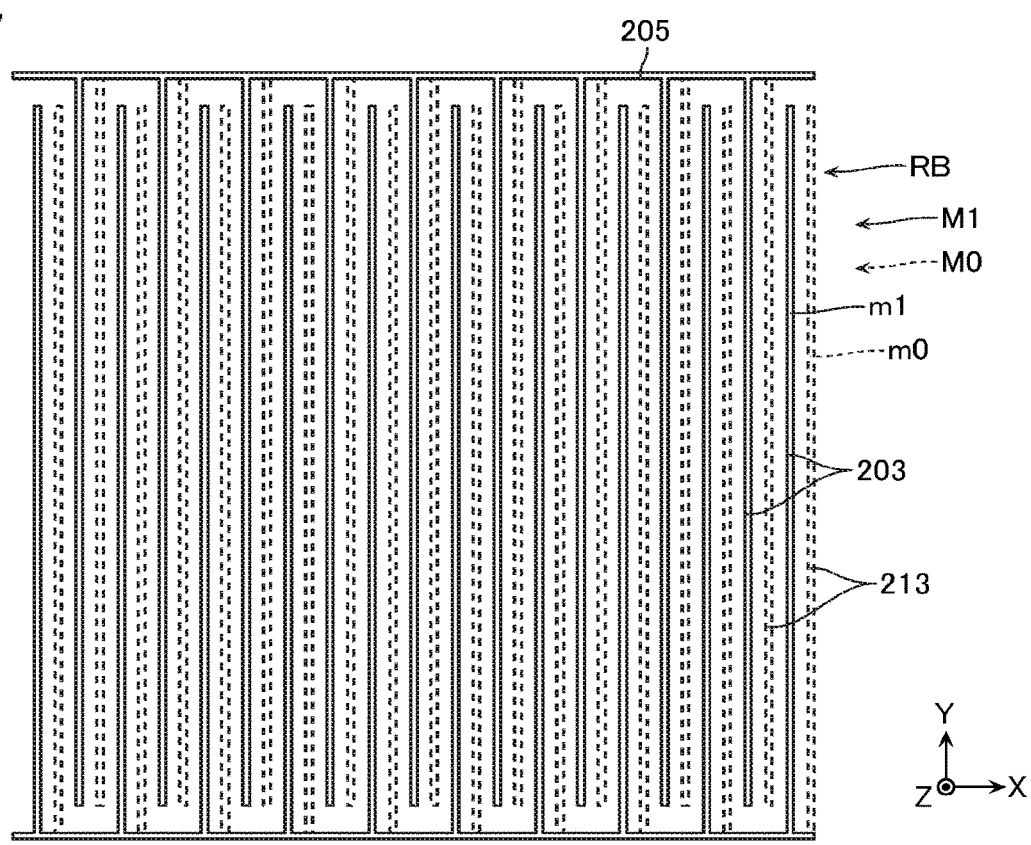
FIG. 27 is a schematic plan view illustrating a configuration in the bonding pad area RB of another exemplary configuration of the semiconductor memory device according to the second embodiment.

Moreover, for example, in the structure described with reference to FIG. 20 to FIG. 22, the respective structures disposed in the wiring layers MX, M0, M1 are disposed so as to overlap viewed in the Z-direction. However, for example, these structures can be disposed to be displaced. For example, as exemplified in FIG. 27, when viewed in the Z-direction, the conducting members 203 in FIG. 20 may overlap with the insulating layers 214 in FIG. 21, and the insulating layers 204 in FIG. 20 may overlap with the conducting members 213 in FIG. 21. The same applies to the configurations in the wiring layers MX, M1. Further, the same applies to the configurations in FIG. 23 to FIG. 25.

In the above-described example, the arrangement density of the contacts c1 inside the circle C3 with the radius R3 around the point p is lower than the arrangement density of the contacts c1 outside the circle C3. However, which arrangement density of the contacts is to be adjusted is appropriately adjustable. For example, at least one arrangement density of the contacts c0, c1, c2 inside the circle C3 can be lower than the arrangement density of them outside the circle C3.

Other Embodiments

In the first embodiment and the second embodiment, the structure in the bonding pad area RB has been described with the example of the semiconductor memory device. However, the structures as described in the first embodiment and the second embodiment are also applicable to a semiconductor device other than the semiconductor memory device. As the semiconductor device other than the semiconductor memory device, for example, a system LSI, a processing unit, such as a CPU, or a microcomputer, any sensor including an image sensor, and a semiconductor element, such as a transistor, are considered.

In the first embodiment and the second embodiment, the example in which the wiring layer M2 including the bonding pad electrodes P are disposed above the semiconductor substrate S and the three wiring layers MX, M0, M1 are disposed between the semiconductor substrate S and the wiring layer M2 has been described. However, the number of wiring layers disposed between the semiconductor substrate S and the wiring layer M2 is appropriately adjustable. For example, at least one of the three wiring layers MX, M0, M1 may be omitted to reduce the number of wiring layers, or the number of wiring layers may be increased.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate;
   a plurality of first wiring layers laminated in a first direction intersecting with a surface of the substrate, the plurality of first wiring layers including a plurality of conducting members; and
   a second wiring layer that is farther from the substrate than the plurality of first wiring layers and includes a bonding pad electrode, wherein
   the plurality of first wiring layers each include a bonding pad area, and the bonding pad area overlaps with the bonding pad electrode viewed in the first direction,
   the conducting member is absent in an area inside a first imaginary circle with a first point as a midpoint in the bonding pad area,
   the conducting members are disposed in an area outside a second imaginary circle in the bonding pad area, the second imaginary circle has the first point as a midpoint and has a radius equal to or more than a radius of the first imaginary circle, and the conductive members being disposed in a predetermined pattern or the conducting members being disposed in the entire area outside the second imaginary circle in the bonding pad area, and
   when the radius of the first imaginary circle is denoted as R1 and the radius of the second imaginary circle is denoted as R2, R2/R1 is smaller than $1/\cos(\pi/4)$.

2. The semiconductor device according to claim 1, wherein
   the first imaginary circle has a diameter smaller than a width in a second direction of the bonding pad electrode, and the second direction intersects with the first direction.

3. The semiconductor device according to claim 1, wherein
   the first imaginary circle has a diameter greater than a width in a second direction of the bonding pad electrode, and the second direction intersects with the first direction.

4. The semiconductor device according to claim 1, wherein
   the first imaginary circle internally includes an area corresponding to a contact surface between the bonding pad electrode and a bonding wire.

5. The semiconductor device according to claim 1, wherein
   the R2/R1 is smaller than $1/\cos(\pi/8)$.

6. The semiconductor device according to claim 1, wherein
   the conducting members are disposed in the entire area outside the second imaginary circle in the bonding pad area.

7. The semiconductor device according to claim 1, wherein
   the conducting members are disposed in the predetermined pattern in the area outside the second imaginary circle in the bonding pad area,
   the conducting members include a plurality of first conducting members, and the plurality of first conducting members extend in a second direction intersecting with the first direction and are arranged in a third direction intersecting with the first direction and the second direction, and
   insulating members that extend in the second direction are disposed between the plurality of first conducting members.

8. The semiconductor device according to claim 1, wherein
   the conducting members are disposed in the predetermined pattern in the area outside the second imaginary circle in the bonding pad area, wherein
   the conducting members include:
   a plurality of first conducting members that extend in a second direction intersecting with the first direction, and the plurality of first conducting members are arranged in a third direction intersecting with the first direction and the second direction; and
   a plurality of second conducting members that extend in the third direction, are arranged in the second direction, and are connected to the plurality of first conducting members, wherein
   insulating members are disposed at parts positioned between the plurality of first conducting members and between the plurality of second conducting members.

9. The semiconductor device according to claim 1, further comprising
   a plurality of contacts that extend in the first direction, the plurality of contacts being connected to a plurality of conducting members included in the plurality of first wiring layers, wherein
   the contact is absent in the area inside the first imaginary circle in the bonding pad area, and
   the contacts are disposed in the area outside the second imaginary circle in the bonding pad area.

10. The semiconductor device according to claim 1, further comprising
    a memory layer disposed between the substrate and the plurality of first wiring layers, wherein
    the memory layer includes a memory cell array and a first insulating member,
    the memory cell array includes:
    a plurality of first wirings laminated in the first direction;
    semiconductor members that extend in the first direction and are opposed to the plurality of first wirings; and electric charge accumulating films disposed between the plurality of first wirings and the semiconductor members, the plurality of first wiring layers include a second insulating member, and the second insulating member is disposed in the areas inside the first imaginary circles in the bonding pad areas, and the second insulating member is connected to the first insulating member.

11. A semiconductor device comprising:

a substrate;

a plurality of first wiring layers laminated in a first direction intersecting with a surface of the substrate, the plurality of first wiring layers including a plurality of conducting members; and a second wiring layer that is farther from the substrate than the plurality of first wiring layers and includes a bonding pad electrode, wherein the plurality of first wiring layers each include a bonding pad area, and the bonding pad area overlaps with the bonding pad electrode viewed in the first direction, the bonding pad areas in the plurality of first wirings include any one of:

a first pattern that includes the plurality of conducting members and insulating members, the plurality of conducting members extending in a second direction intersecting with the first direction, the plurality of conducting members being arranged in a third direction intersecting with the first direction and the second direction, the insulating members extending in the second direction and being arranged in the third direction, and the insulating members being disposed between the conducting members in the third direction; and a second pattern that includes the plurality of conducting members and insulating members, the plurality of conducting members extending in the third direction and being arranged in the second direction, the insulating members extending in the third direction and being arranged in the second direction, and the insulating members being disposed between the conducting members in the second direction.

12. The semiconductor device according to claim 11, wherein when one of the plurality of first conducting layers is defined as a third conducting layer and another of the plurality of first conducting layers is defined as a fourth conducting layer:

the third conducting layer includes the first pattern; and the fourth conducting layer includes the first pattern.

13. The semiconductor device according to claim 12, wherein the conducting member included in the third conducting layer overlaps with the conducting member included in the fourth conducting layer viewed in the first direction, and the insulating member included in the third conducting layer overlaps with the insulating member included in the fourth conducting layer viewed in the first direction.

14. The semiconductor device according to claim 12, wherein the conducting member included in the third conducting layer overlaps with the insulating member included in the fourth conducting layer viewed in the first direction, and the insulating member included in the third conducting layer overlaps with the conducting member included in the fourth conducting layer viewed in the first direction.

15. The semiconductor device according to claim 11, wherein when one of the plurality of first conducting layers is defined as a third conducting layer and another of the plurality of first conducting layers is defined as a fifth conducting layer:

the third conducting layer includes the first pattern; and the fifth conducting layer includes the second pattern.

16. The semiconductor device according to claim 11, further comprising a plurality of contacts that extend in the first direction, the plurality of contacts being connected to a plurality of conducting members included in the plurality of first wirings, wherein when an arrangement density of the contacts in an area inside a first imaginary circle with a first point as a midpoint in the bonding pad area is defined as a first arrangement density and when an arrangement density of the contacts in an area outside the first imaginary circle in the bonding pad area is defined as a second arrangement density, the first arrangement density is smaller than the second arrangement density.

* * * * *